(12) United States Patent
Lin et al.

(10) Patent No.: US 12,336,174 B2
(45) Date of Patent: Jun. 17, 2025

(54) MEMORY STRUCTURE HAVING AIR GAP AND METHOD FOR MANUFACTURING THE SAME

(71) Applicant: TAIWAN SEMICONDUCTOR MANUFACTURING COMPANY, LTD., Hsinchu (TW)

(72) Inventors: Meng-Han Lin, Hsinchu (TW); Chia-En Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 532 days.

(21) Appl. No.: 17/707,562

(22) Filed: Mar. 29, 2022

(65) Prior Publication Data

US 2023/0320084 A1    Oct. 5, 2023

(51) Int. Cl.
| | |
|---|---|
| H10B 41/27 | (2023.01) |
| H01L 23/48 | (2006.01) |
| H10B 41/10 | (2023.01) |
| H10B 43/10 | (2023.01) |
| H10B 43/27 | (2023.01) |
| H10D 62/10 | (2025.01) |

(52) U.S. Cl.
CPC ........... *H10B 41/27* (2023.02); *H01L 23/481* (2013.01); *H10B 41/10* (2023.02); *H10B 43/10* (2023.02); *H10B 43/27* (2023.02); *H10D 62/115* (2025.01)

(58) Field of Classification Search
CPC .......... H01L 29/0649; H10B 41/00–35; H10B 43/00–50
See application file for complete search history.

(56) References Cited

U.S. PATENT DOCUMENTS

| | | | |
|---|---|---|---|
| 2015/0179661 A1* | 6/2015 | Huo | H01L 29/40117 257/315 |
| 2019/0013328 A1* | 1/2019 | Kim | H01L 24/29 |

\* cited by examiner

*Primary Examiner* — Evren Seven
(74) *Attorney, Agent, or Firm* — Birch, Stewart, Kolasch & Birch, LLP

(57) ABSTRACT

A semiconductor device includes a substrate and a memory structure disposed over the substrate. The memory structure includes a pair of first conductive lines, a channel element disposed between the pair of the first conductive lines and formed with an air gap therein, a first memory element disposed to separate one of the pair of the first conductive lines from the channel element, and a second memory element disposed to separate the other one of the pair of the first conductive lines from the channel element. A method for manufacturing the semiconductor device is also disclosed.

20 Claims, 23 Drawing Sheets

MEMORY STRUCTURE HAVING AIR GAP AND METHOD FOR MANUFACTURING THE SAME

BACKGROUND

Semiconductor memory structures are widely used in computers, portable devices, automotive parts, and internet of things (IoT), etc. With increasing requirement of the semiconductor memory structures to have a high memory capacity, in addition to scale down memory cells, a memory array tends to be developed to have a three-dimensional (3D) architecture instead of a two-dimensional (2D) architecture, so that the memory capacity of the semiconductor memory structures can be effectively increased with a relatively small area penalty.

A capacitance between two adjacent ones of a plurality of word lines of a 3D semiconductor memory structure is very important to determine an operation speed of the 3D semiconductor memory structure. Hence, there are demands to develop a 3D semiconductor memory structure with a reduced capacitance between two adjacent ones of the word lines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
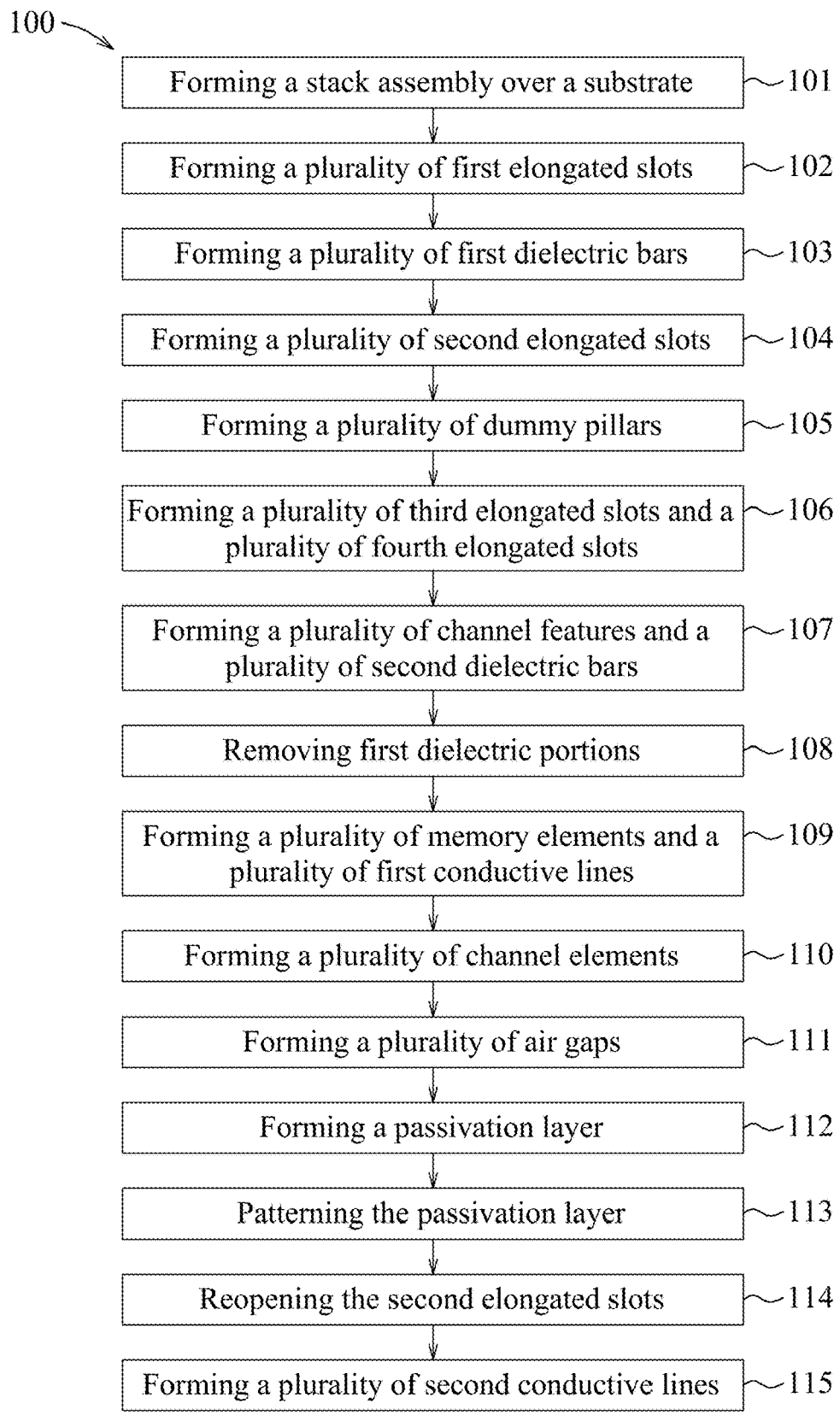
FIG. 1 is a flow diagram illustrating a method for manufacturing a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "upper," "lower," "over," "downwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a semiconductor device including a three-dimensional (3D) memory structure with air gaps and a method for manufacturing the same. FIG. 1 illustrates a method 100 for manufacturing a semiconductor device in accordance with some embodiments. FIGS. 2A to 16B illustrate schematic perspective views of some intermediate stages of the method 100 shown in FIG. 1. Additional steps can be provided before, after or during the method 100, and some of the steps described herein may be replaced by other steps or be eliminated. Similarly, further additional features may be present in a semiconductor device 200 illustrated in FIG. 16A, and/or features present may be replaced or eliminated in additional embodiments.

Figure 2B:
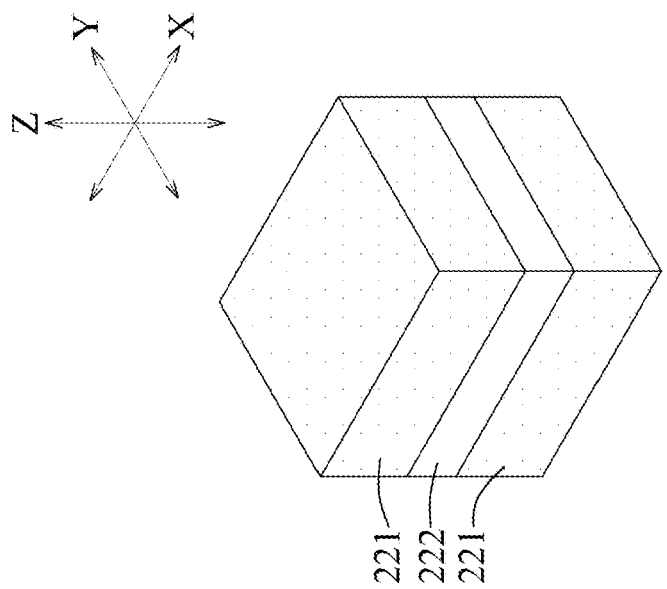
FIGS. 2A to 16B are schematic perspective views illustrating some intermediate stages of the manufacturing method as depicted in FIG. 1 in accordance with some embodiments.
Figure 2A:
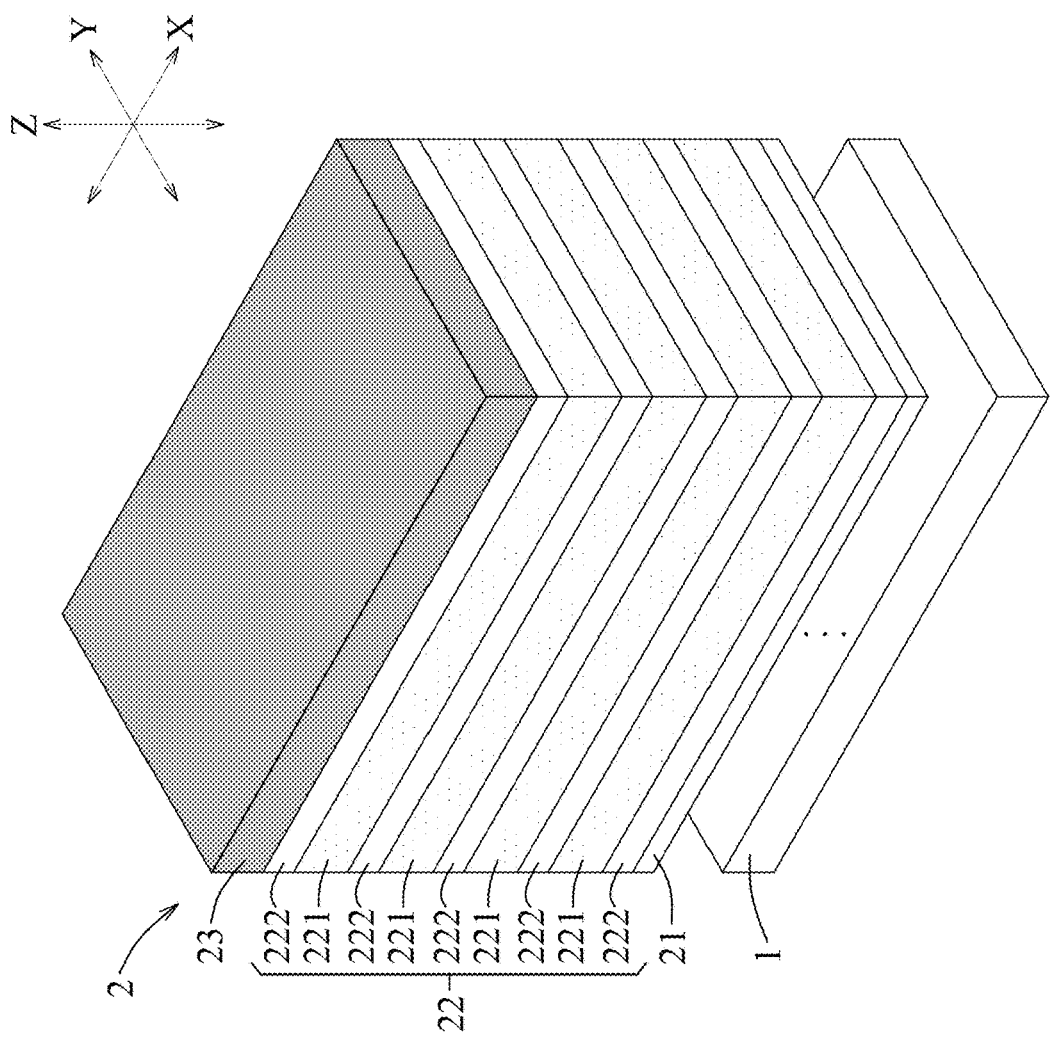

Referring to FIG. 1 and the example illustrated in FIGS. 2A and 2B, the method 100 begins at step 101, where a stack assembly is formed over a substrate. FIG. 2A is a schematic perspective view of a stack assembly 2 formed over a substrate 1. The stack assembly 2 includes an etch stop layer (ESL) 21, a multi-layer dielectric stack 22, and a dummy layer 23, which are formed sequentially over the substrate 1. FIG. 2B is a schematic perspective view of a portion of the configuration shown in FIG. 2A.

In some embodiments, the substrate 1 may include a semiconductor substrate. The semiconductor substrate may be, for example, but not limited to, a silicon-on-insulator (SOI) substrate, a germanium-on-insulator (GOI) substrate, a bulk semiconductor substrate, or the like, and may be doped with a dopant. The substrate 1 may have multiple layers. The substrate 1 may include elemental semiconductor materials, such as crystalline silicon, diamond, or germanium; compound semiconductor materials, such as silicon carbide, gallium arsenic, indium arsenide, gallium phosphide, indium arsenide, indium phosphide, or indium antimonide; alloy semiconductor materials, such as silicon germanium, silicon germanium carbide, gallium arsenic phosphide, aluminum gallium arsenide, or gallium indium phosphide; or combinations thereof. Other materials suitable for the substrate 1 are within the contemplated scope of the disclosure.

The etch stop layer 21 is formed over the substrate 1 by a suitable fabrication technique known to those skilled in the art of semiconductor fabrication, for example, but not limited to, chemical vapor deposition (CVD), physical vapor deposition (PVD), atomic layer deposition (ALD), plasma-enhanced CVD (PECVD), or the like. Other suitable techniques for forming the etch stop layer 21 are within the contemplated scope of the disclosure. In some embodiments, the etch stop layer 21 may be made of a dielectric material, for example, but not limited to, silicon nitride, silicon nitride doped with carbon, silicon oxide, silicon oxynitride, silicon oxynitride doped with carbon, amorphous carbon material, silicon carbide, other nitride materials, other carbide materials, aluminum oxide, other oxide materials, other metal oxides, boron nitride, boron carbide, and other low-k dielectric materials or low-k dielectric materials doped with one or more of carbon, nitrogen, and hydrogen, or other suitable materials. Other materials suitable for the etch stop layer 21 are within the contemplated scope of the disclosure.

The multi-layer dielectric stack 22 includes a plurality of first dielectric layers 221 and a plurality of second dielectric layers 222, which are alternately stacked on the etch stop layer 21. In some embodiments, the first dielectric layers 221 may include, for example, but not limited to, silicon oxide (SiO), and the second dielectric layers 222 may include, for example, but not limited to, silicon nitride (SiN). Other materials suitable for the first and second dielectric layers 221, 222 are within the contemplated scope of the disclosure. In some embodiments, the uppermost and lowermost layers of the multi-layer dielectric stack 22 are the second dielectric layers 222, and are disposed to be in contact with the dummy layer 23 and the etch stop layer 21, respectively.

The dummy layer 23 may be made of a material having an etching selectivity different from those of the materials for the first and second dielectric layers 221, 222. In some embodiments, the material for the dummy layer 23 may include, for example, but not limited to, polysilicon, silicon carbide, silicon oxycarbide, or the like, or combinations thereof. Other materials suitable for the dummy layer 23 are within the contemplated scope of the disclosure. The dummy layer 23 may be formed on the multi-layer dielectric stack 22 by a suitable fabrication technique known to those skilled in the art of semiconductor fabrication, for example, but not limited to, CVD, PVD, ALD, PECVD, or the like. Other suitable techniques for forming the dummy layer 23 are within the contemplated scope of the disclosure.

Figure 3B:
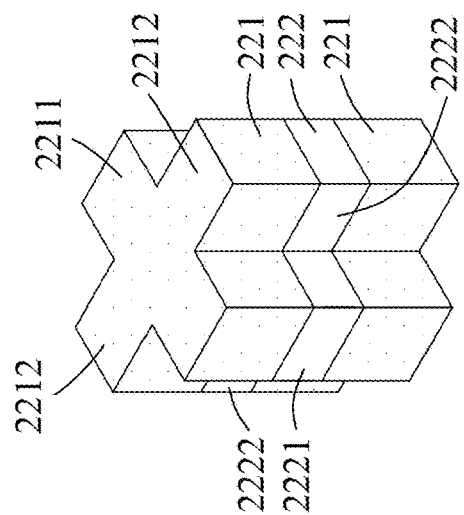
Figure 3A:
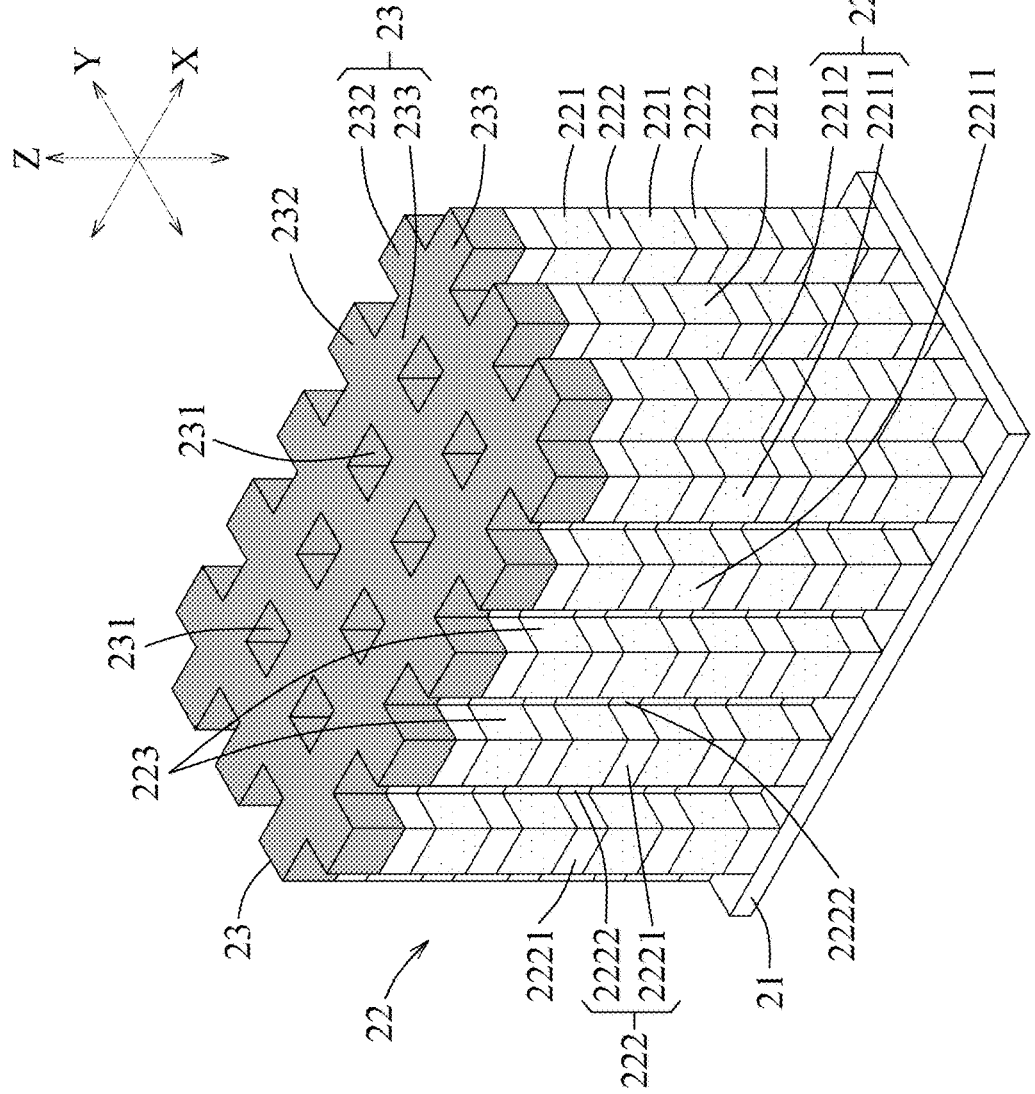

Referring to FIG. 1 and the example illustrated in FIGS. 3A and 3B, the method 100 then proceeds to step 102, where a plurality of first elongated slots are formed. FIG. 3A illustrates a configuration subsequent to that shown in FIG. 2A, and FIG. 3B is a schematic perspective view of a portion of the configuration shown in FIG. 3A. In some embodiments, formation of the first elongated slots 223 in an array arrangement includes the following steps. First, a hard mask (not shown) is formed on the dummy layer 23 shown in FIG. 2A by a suitable fabrication technique known to those skilled in the art of semiconductor fabrication, for example, but not limited to, CVD, PVD, ALD, PECVD, or the like. Other suitable techniques for forming the hard mask are within the contemplated scope of the disclosure. A photoresist layer (not shown) is then formed on the hard mask by a suitable fabrication technique known to those skilled in the art of semiconductor fabrication, for example, but not limited to, a spin-on technique. Other suitable techniques for forming the photoresist layer are within the contemplated scope of the disclosure. The photoresist layer is then patterned using a suitable photolithography technique to form a pattern of recesses in position corresponding to the first elongated slots 223 to be formed. For example, the photoresist layer is exposed to light for patterning, followed by developing to form the pattern of the recesses. The pattern of the recesses formed in the photoresist layer is transferred to the hard mask using a suitable etching process, for example, but not limited to, a wet etching process, a dry etching process, a reactive ion etching process, a neutral beam etching process, or the like. After the pattern of the recesses is transferred to the hard mask, the photoresist layer may be removed by, for example, but not limited to, an ashing process. The pattern of the recesses formed in the hard mask is then transferred to the dummy layer 23 using a suitable etching process, for example, but not limited to, a wet etching process, a dry etching process, or the like, so as to form an array of openings 231 extending through the dummy layer 23. Thereafter, the hard mask may be removed by a suitable process, for example, but not limited to, a wet etching process, a dry etching process, a planarization process, or the like. An array of the openings 231 formed in the dummy layer 23 includes a plurality of columns of the openings 231 spaced apart from each other in a first direction (e.g., an X direction direction), and the openings 231 in each of the columns are spaced apart from each other in a second direction (e.g., a Y direction) transverse to the first direction. The pattern of the openings 231 formed in the dummy layer 23 is then transferred to the multi-layer dielectric stack 22 using a suitable etching process, for example, but not limited to, a wet etching process, a dry etching process, or the like, so as to form an array of the first elongated slots 223 extending downwardly from an upper surface of the dummy layer 23 and through the multi-layer dielectric stack 22 in a third direction (e.g., a Z direction) transverse to the first and second directions to terminate at the etch stop layer 21. In some embodiments, the first, second, and third directions are perpendicular to one another. In some embodiments, the hard mask may be removed after the first elongated slots 223 are formed. An array of the first elongated slots 223 includes a plurality of columns of the first elongated slots 223 spaced apart from each other in the X direction, and the first elongated slots 223 in each of the columns are spaced part from each other in the Y direction. Each of the first dielectric layers 221 and the second dielectric layers 222 is thus patterned into a grid-shaped configuration. Each of the first dielectric layers 221 in the grid-shaped configuration includes a plurality of first dielectric portions 2211 elongated in the Y direction and spaced apart from each other in the X direction, and a plurality of columns of second dielectric portions 2212 disposed to alternate with the first dielectric portions 2211 in the X direction. The columns of the second dielectric portions 2212 are spaced apart from each other in the X direction, and the second dielectric portions 2212 in each of the columns are spaced apart from each other in the Y direction. Two adjacent ones of the first dielectric portions 2211 are interconnected with each other through a corresponding one column of the second dielectric portions 2212. Similarly, each of the second dielectric layers 222 in the grid-shaped configuration includes a plurality of third dielectric portions 2221 elongated in the Y direction and spaced apart from each other in the X direction, and a plurality of columns of fourth dielectric portions 2222 disposed to alternate with the third dielectric portions 2221 in the X direction. The columns of the fourth dielectric portions 2222 are spaced apart from each other in the X direction, and the fourth dielectric portions 2222 in each of the columns are spaced apart from each other in the Y direction. Two adjacent ones of the third dielectric portions 2221 are interconnected with each other through a corresponding one column of the fourth dielectric portions 2222. Similarly, the dummy layer 23 is patterned into the grid-shaped configuration, and includes a plurality of first dummy portions 232 elongated in the Y direction and spaced apart from each other in the X direction and a plurality of columns of second dummy portions 233 disposed to alternate with the first dummy portions 232 in the X direction. The columns of the second dummy portions 233 are spaced apart from each other in the X direction, and the second dummy portions 233 in each of the columns are spaced apart from each other in the Y direction. Two adjacent ones of the first dummy portions 233 are interconnected with each other through a corresponding one column of the second dummy portions 233.

Figure 4B:
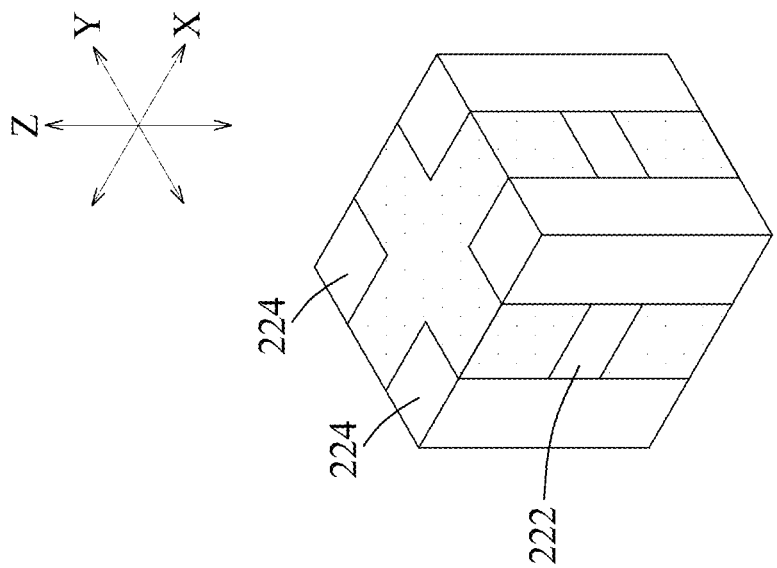
Figure 4A:
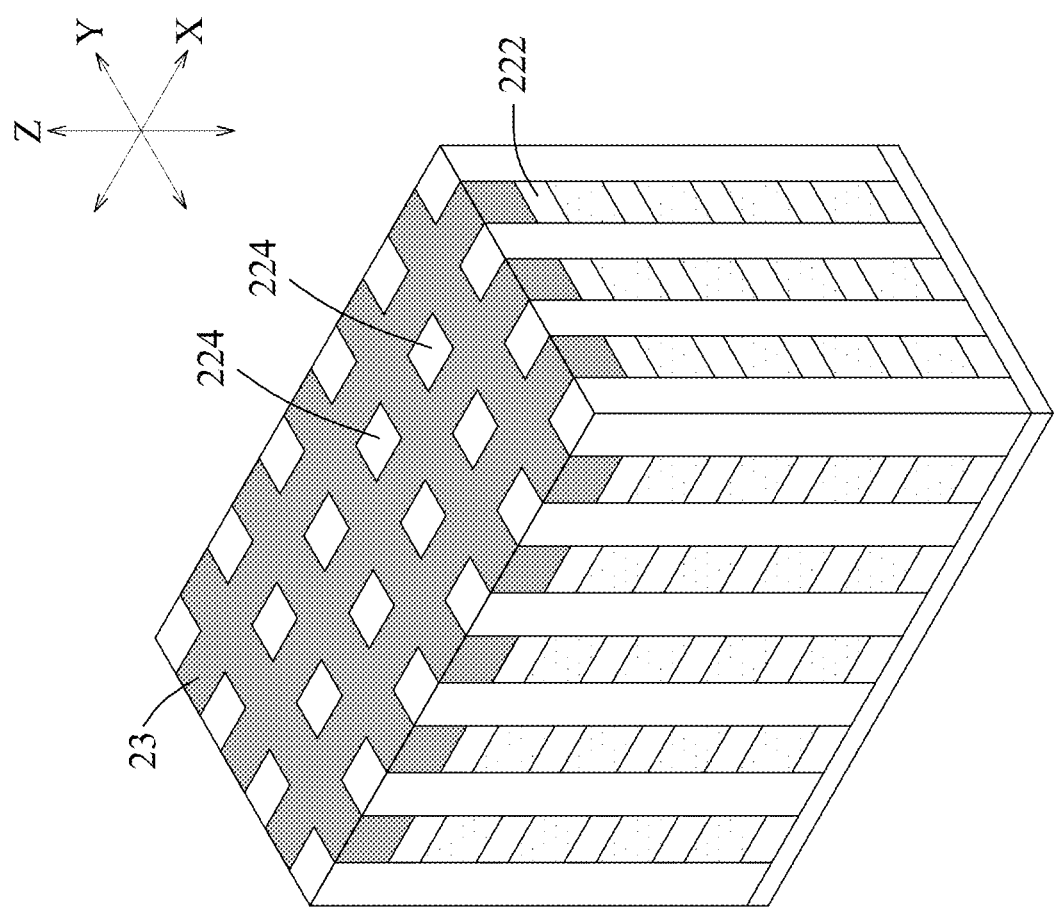

Referring to FIG. 1 and the example illustrated in FIGS. 4A and 4B, the method 100 then proceeds to step 103, where a plurality of first dielectric bars are formed. FIG. 4A illustrates a configuration subsequent to that shown in FIG. 3A, and FIG. 4B is a schematic perspective view of a portion of the configuration shown in FIG. 4A. The first elongated slots 223 shown in FIG. 3A are filled with a dielectric material, and excess of the dielectric material above the dummy layer 23 is removed by a planarization technique, such as chemical mechanical planarization (CMP) such that a plurality of first dielectric bars 224 in an array arrangement are formed and are elongated in the Z direction. An array of the first dielectric bars 224 includes a plurality of columns of the first dielectric bars 224 spaced apart from each other in the X direction, and the first dielectric bars 224 in each of the columns are spaced apart from each other in the Y direction. In some embodiments, the dielectric material for forming the first dielectric bars 224 may be the same as a dielectric material for forming the second dielectric layers 222. In some embodiments, both the dielectric material for forming the first dielectric bars 224 and the dielectric material for forming the second dielectric layers 222 are silicon nitride (SiN).

Figure 5B:
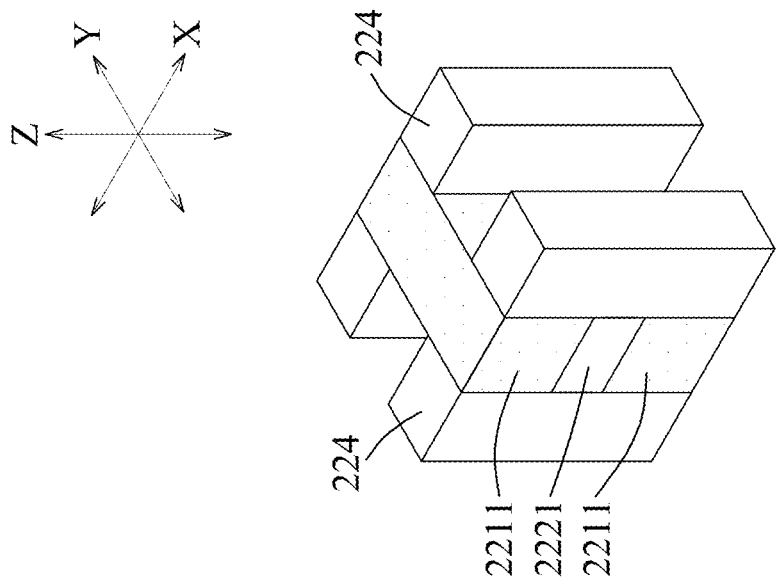
Figure 5A:
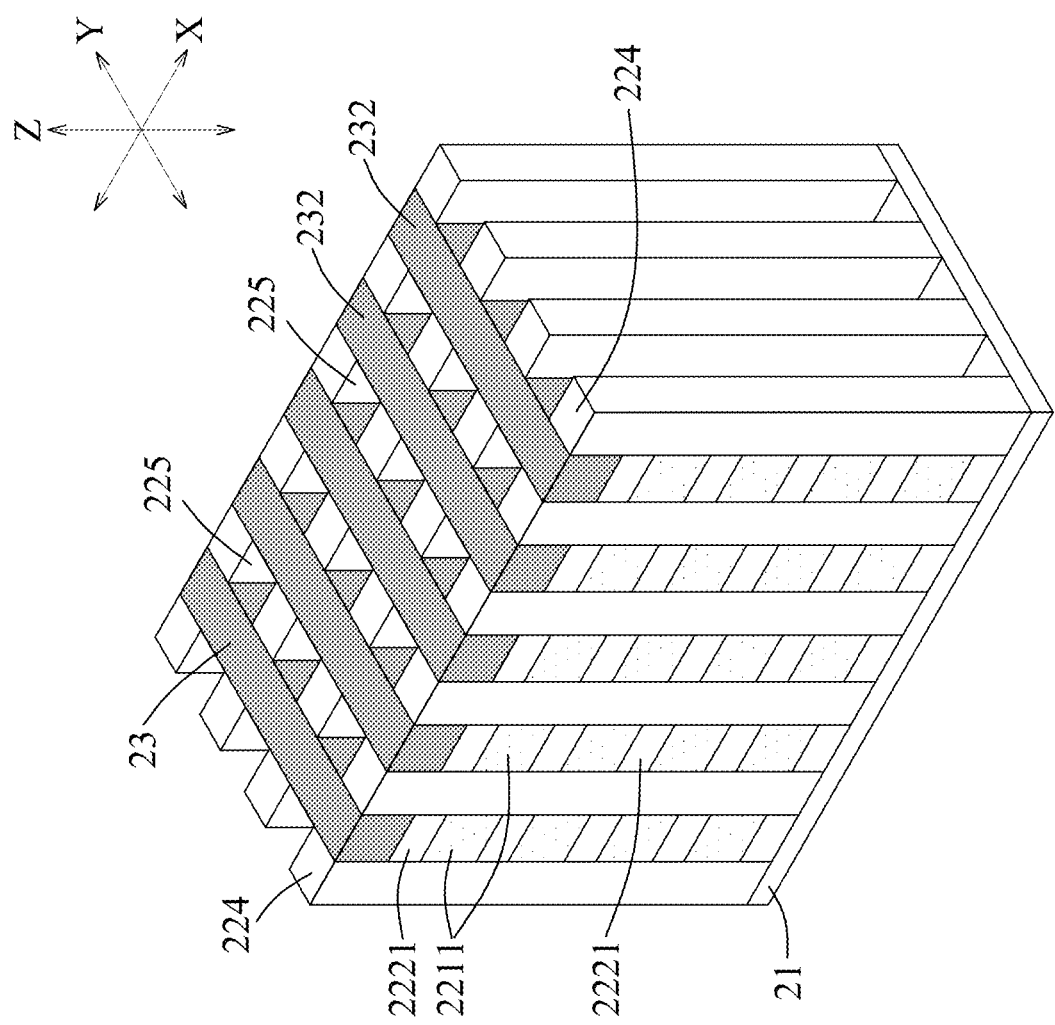

Referring to FIG. 1 and the example illustrated in FIGS. 5A and 5B, the method 100 then proceeds to step 104, where a plurality of second elongated slots are formed. FIG. 5A illustrates a configuration subsequent to that shown in FIG. 4A, and FIG. 5B is a schematic perspective view of a portion of the configuration shown in FIG. 5A. In some embodiments, the process for forming the second elongated slots 225 in an array arrangement is the same as or similar to that for forming the first elongated slots 223 described above, and the details thereof are omitted for the sake of brevity. In the formation of the second elongated slots 225, the second and fourth dielectric portions 2212, 2222 are removed, such that the first dummy portions 232, the first dielectric portions 2211, and the third dielectric portions 2221 remain and a plurality of the second elongated slots 225 in an array arrangement are formed to extend downwardly from an upper surface of the configuration shown in FIG. 5A in the Z direction to terminate at the etch stop layer 21. An array of the second elongated slots 225 includes a plurality of columns of the second elongated slots 225 spaced apart from each other in the X direction, and the second elongated slots 225 in each of the columns are spaced part from each other in the Y direction. The first dielectric portions 2211 are disposed in an array arrangement and are elongated in the Y direction. The array of the first dielectric portions 2211 includes a plurality of columns of the first dielectric portions 2211 spaced apart from each other in the X direction, and the first dielectric portions 2211 in each of the columns are spaced apart from each other in the Z direction. Similarly, the third dielectric portions 2221 are disposed in an array arrangement and are elongated in the Y direction. An array of the third dielectric portions 2221 includes a plurality of columns of the third dielectric portions 2221 spaced apart from each other in the X direction, and the third dielectric portions 2221 in each of the columns are spaced apart from each other in the Z direction. The first dummy portions 232 are elongated in the Y direction and are spaced apart from each other in the X direction.

Figure 6B:
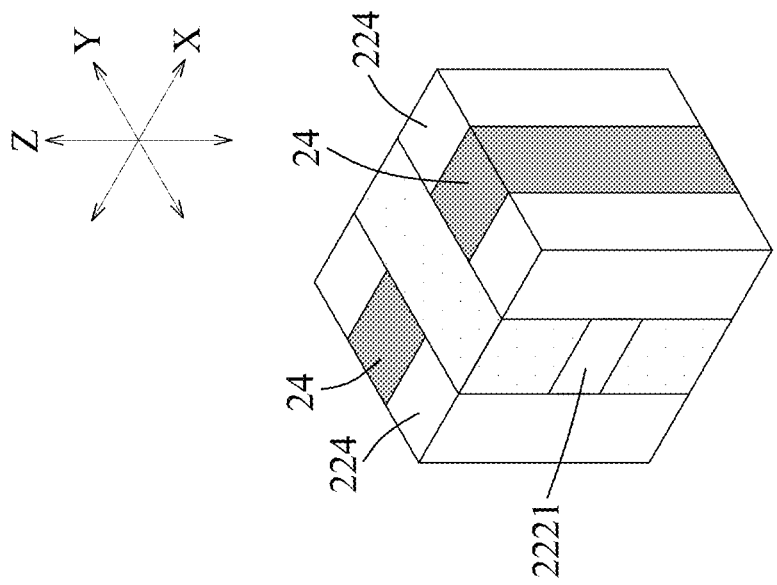
Figure 6A:
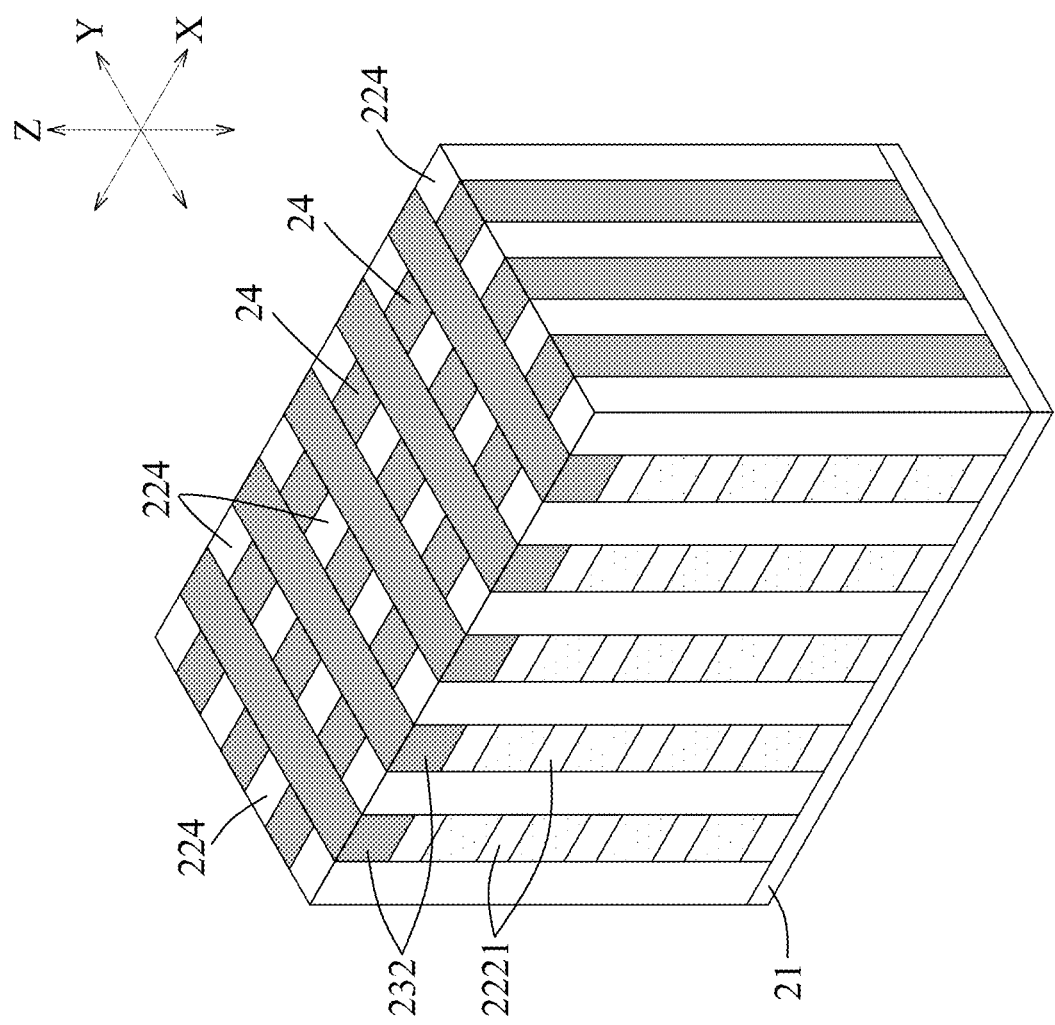

Referring to FIG. 1 and the example illustrated in FIGS. 6A and 6B, the method 100 then proceeds to step 105, where a plurality of dummy pillars are formed. FIG. 6A illustrates a configuration subsequent to that shown in FIG. 5A, and FIG. 6B is a schematic perspective view of a portion of the configuration shown in FIG. 6A. The second elongated slots 225 shown in FIG. 5A are filled with a dummy material, and excess of the dummy material above the first dummy portions 232 and the first dielectric bars 224 is removed by a planarization technique, for example, CMP, such that a plurality of dummy pillars 24 in an array arrangement are formed and are elongated downwardly in the Z direction to terminate at the etch stop layer 21. An array of the dummy pillars 24 includes a plurality of columns of the dummy pillars 24 spaced apart from each other in the X direction, and the dummy pillars 24 in each of the columns are spaced apart from each other in the Y direction. Two adjacent ones of the first dummy portions 232 are interconnected with each other through upper portions of a corresponding one column of the dummy pillars 24. In some embodiments, the dummy material for forming the dummy pillars 24 may be the same as that for forming the first dummy portions 232 (i.e., the same as that for forming the dummy layer 23).

Figure 7A:
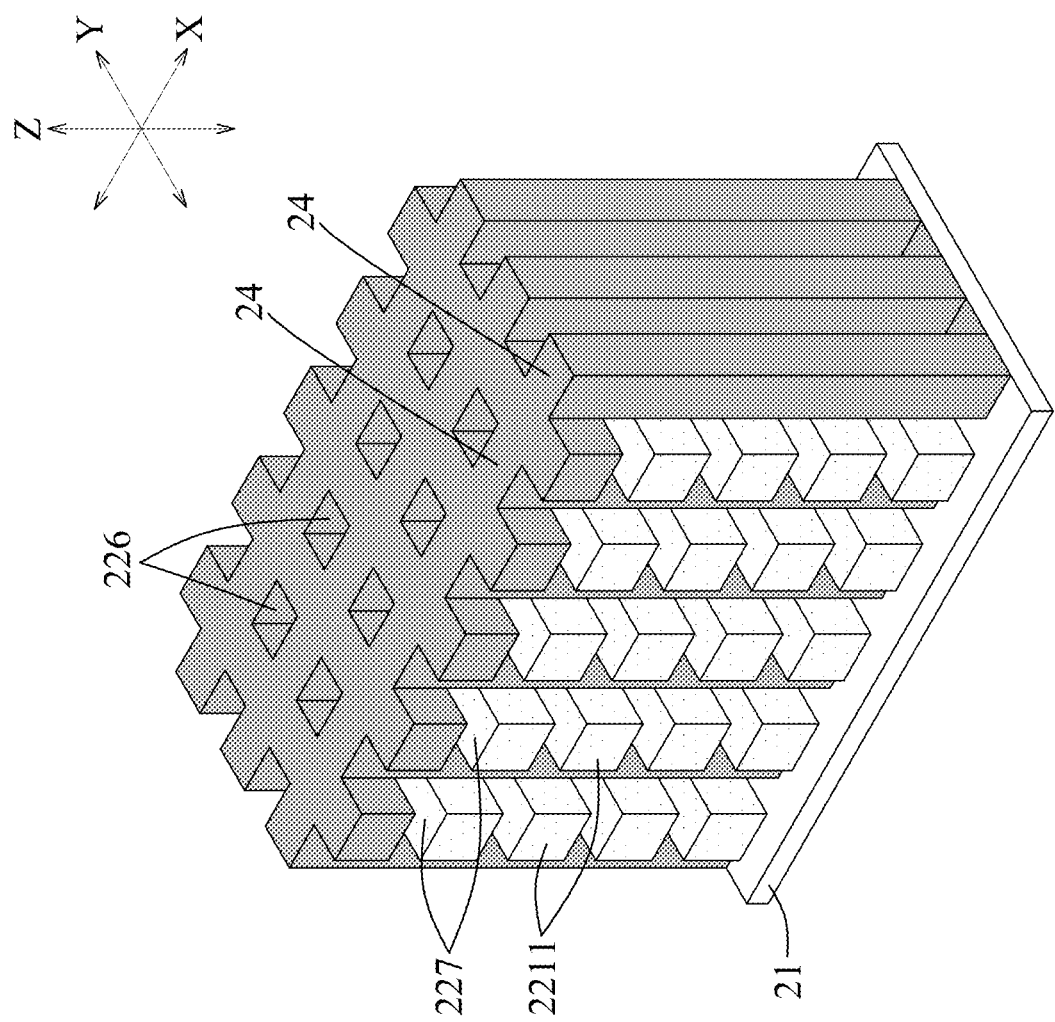
Figure 7B:
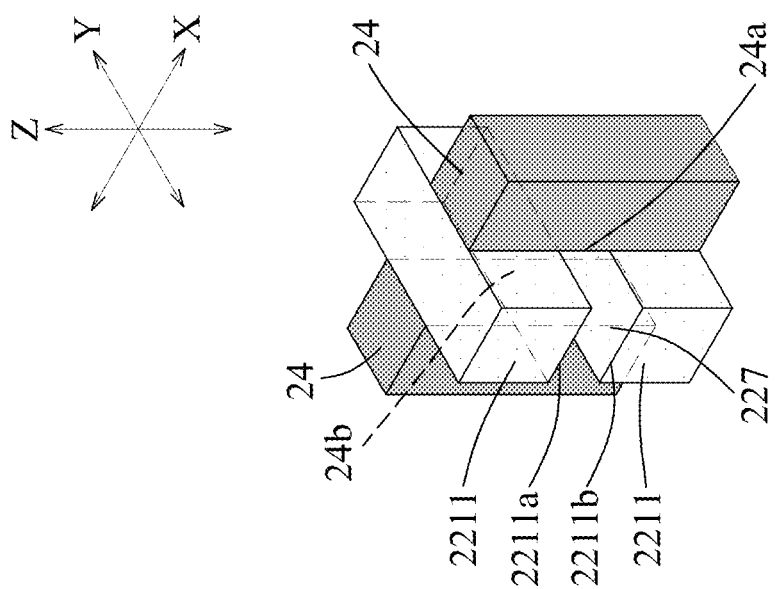

Referring to FIG. 1 and the example illustrated in FIGS. 7A and 7B, the method 100 then proceeds to step 106, where a plurality of third elongated slots and a plurality of fourth elongated slots are formed. FIG. 7A illustrates a configuration subsequent to that shown in FIG. 6A, and FIG. 7B is a schematic perspective view of a portion of the configuration shown in FIG. 7A. The first dielectric bars 224 and the third dielectric portions 2221 shown in FIG. 6A are removed using a suitable etching process, for example, but not limited to, an isotropic wet etching process, an isotropic dry etching process, or the like, such that a plurality of third elongated slots 226 in an array arrangement and a plurality of fourth elongated slots 227 in an array arrangement are formed. The third elongated slots 226 in the array arrangement extend downwardly in the Z direction to terminate at the etch stop layer 21. An array of the third elongated slots 226 includes a plurality of columns of the third elongated slots 226 spaced apart from each other in the X direction. The third elongated slots 226 in each of the columns are spaced apart from each other in the Y direction. The fourth elongated slots 227 in the array arrangement extend in the Y direction. An array of the fourth elongated slots 227 includes a plurality of columns of the fourth elongated slots 227 spaced apart from each other in the X direction. The fourth elongated slots 227 in each of the columns are spaced apart from each other in the Z direction. The fourth elongated slots 227 are in spatial communication with the third elongated slots 226. Two adjacent columns of the dummy pillars 24 are interconnected with each other through a corresponding one column of the first dielectric portions 2211, each of which is configured as a dielectric pillar elongated in the Y direction. In each column of the first dielectric portions 2211, two adjacent ones of the first dielectric portions 2211 have a first wall surface 2211a and a second wall surface 2211b, respectively, which face each other and are spaced apart from each other by a corresponding one of the fourth elongated slots 227 in the Z direction. In two adjacent columns of the dummy pillars 24 spaced apart from each other by the each column of the first dielectric portions 2211, each of the dummy pillars 24 in one column of the dummy pillars 224 and a corresponding one of the dummy pillars 24 in the other one column of the dummy pillars 24 have a third wall surface 24a and a fourth wall surface 24b, respectively, which extend to interconnect the two adjacent ones of the first dielectric portions 2211 of the each column of the first dielectric portions 2211.

Figure 8B:
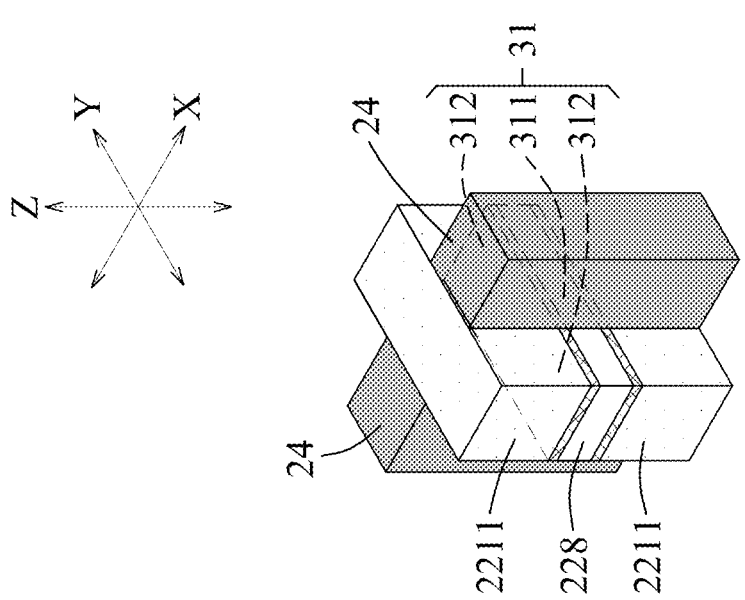
Figure 8A:
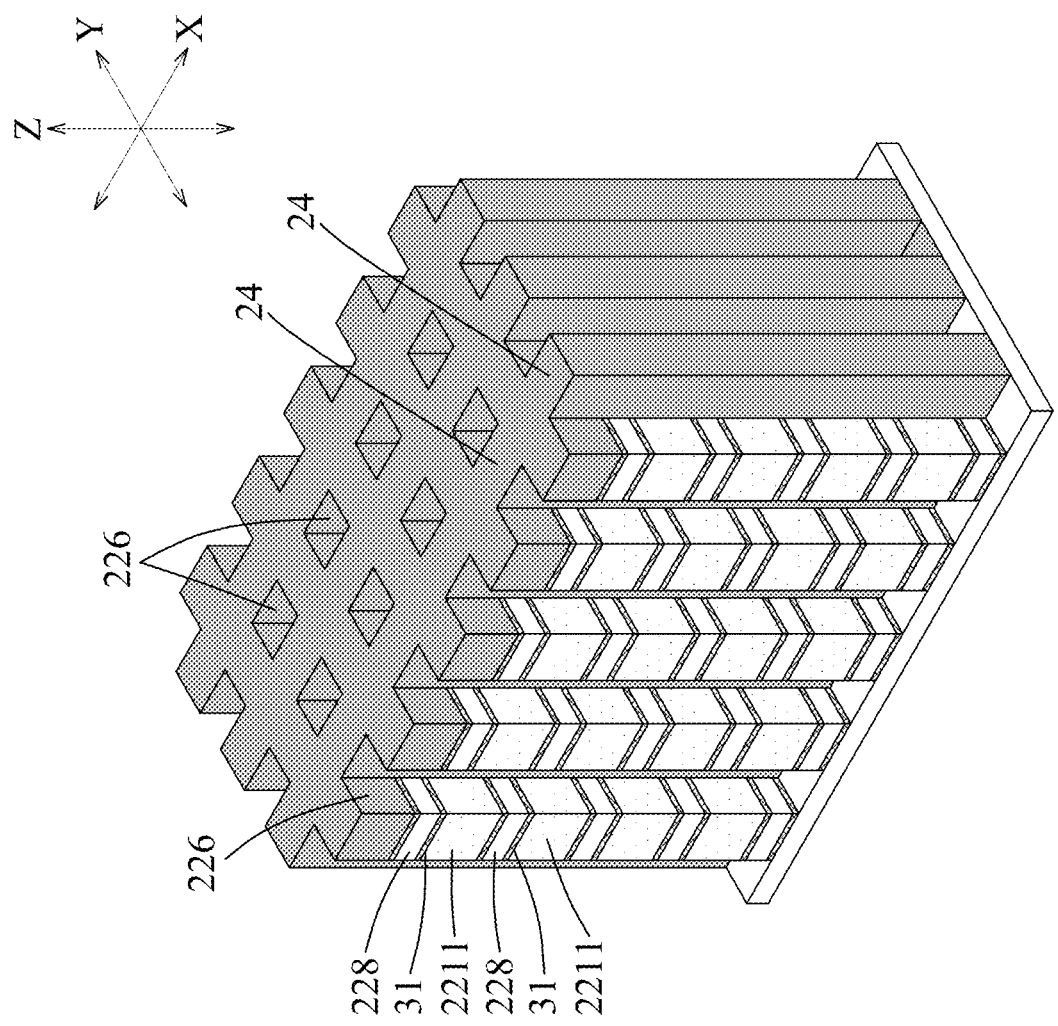

Referring to FIG. 1 and the example illustrated in FIGS. 8A and 8B, the method 100 then proceeds to step 107, where a plurality of channel features and a plurality of second dielectric bars are formed. FIG. 8A illustrates a configuration subsequent to that shown in FIG. 7A, and FIG. 8B is a schematic perspective view of a portion of the configuration shown in FIG. 8A. A channel layer is conformally deposited and a dielectric material is filled into the third and fourth elongated slots 226, 227 shown in FIG. 7A independently by a suitable deposition technique known to those skilled in the art of semiconductor fabrication, for example, but not limited to, CVD, ALD, PVD, PECVD, or the like. Other suitable techniques for conformally depositing the channel layer and filling the dielectric material are within the contemplated scope of the disclosure.

In some embodiments, the channel layer may be made of various semiconductor material. In some embodiments, the semiconductor material for making the channel layer may include, for example, but not limited to, polysilicon, an indium-comprising material, such as $In_{x1}Ga_{x2}Zn_{x3}M_{x4}O$, where M may be Ti, Al, Ag, Si, Sn, W, or the like, and x1, x2, x3 and x4 may each be any value between 0 and 1, or the like, or combinations thereof. In some embodiments, the channel layer may be formed as a single layer having one of the aforesaid materials. In some alternative embodiments, the channel layer may be formed as a laminate structure having at least two of the aforesaid materials in various constitutions. In some embodiments, the channel layer may be doped with a dopant to achieve extra stability. Other materials suitable for the channel layer are within the contemplated scope of the disclosure.

In some embodiments, the dielectric material for filling the third and fourth elongated slots 226, 227 has an etching selectively different from that of the first dielectric portions 2211. In some embodiments, the dielectric material for filling the third and fourth elongated slots 226, 227 includes silicon nitride (SiN).

Portions of the channel layer and portions of the dielectric material in the third elongated slots 226 are removed using a suitable etching process, for example, but not limited to, a wet etching process, a dry etching process, or the like, to form a plurality of second dielectric bars 228 in an array arrangement and a plurality of channel features 31 in an array arrangement and to reopen the third elongated slots 226. The second dielectric bars 228 in the array arrangement are elongated in the Y direction. An array of the second dielectric bars 228 includes a plurality of columns of the second dielectric bars 228 spaced apart from each other in the X direction. The second dielectric bars 228 in each of the columns are disposed to alternate with the first dielectric portions 2211 of a corresponding one column of the first dielectric portions 2211 in the Z direction. The channel features 31 in the array arrangement are elongated in the Y direction. An array of the channel features 31 includes a plurality of columns of the channel features 31 spaced apart from each other in the X direction. Each of the channel features 31 includes a plurality of first channel regions 311 and a plurality of second channel regions 312 disposed to alternate with the first channel regions 311 in the Y direction. Each of the first channel regions 311 is in contact with two corresponding ones of the dummy pillars 24, and the second channel regions 312 are exposed from the dummy pillars 24.

Figure 9B:
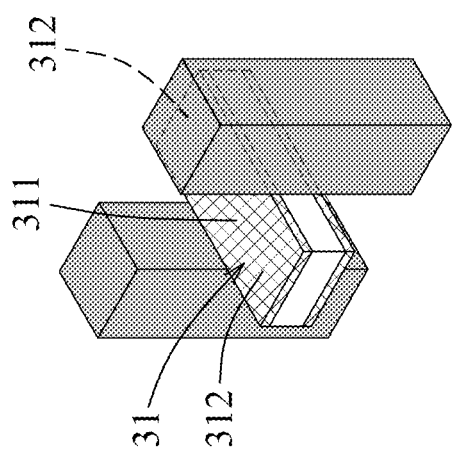
Figure 9A:
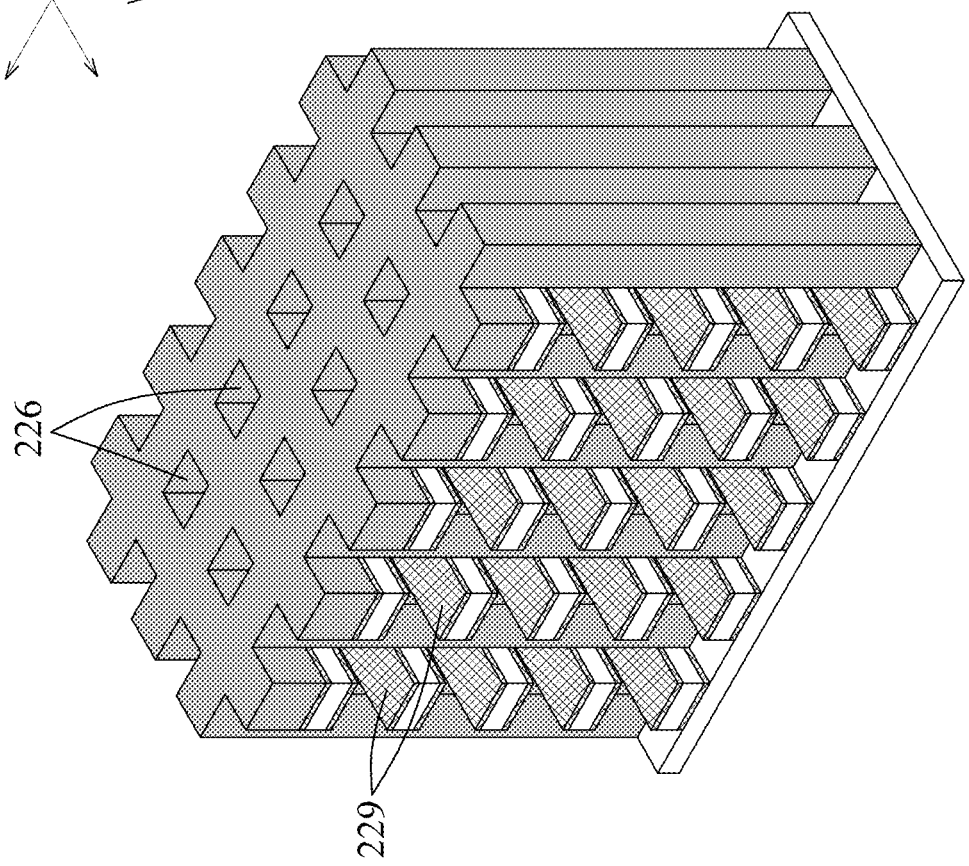

Referring to FIG. 1 and the example illustrated in FIGS. 9A and 9B, the method 100 then proceeds to step 108, where the first dielectric portions are removed. FIG. 9A illustrates a configuration subsequent to that shown in FIG. 8A, and FIG. 9B is a schematic perspective view of a portion of the configuration shown in FIG. 9A. The first dielectric portions 2211 shown in FIG. 8A are removed using a suitable etching process, for example, but not limited to, a wet etching process, a dry etching process, or the like, to form a plurality of fifth elongated slots 229 in an array arrangement. The fifth elongated slots 229 in the array arrangement are elongated in the Y direction. An array of the fifth elongated slots 229 includes a plurality of columns of the fifth elongated slots 229 spaced apart from each other in the X direction. The fifth elongated slots 229 in each of the columns are spaced apart from each other in the Z direction. The fifth elongated slots 229 are in spatial communication with the third elongated slots 226.

Figure 10B:
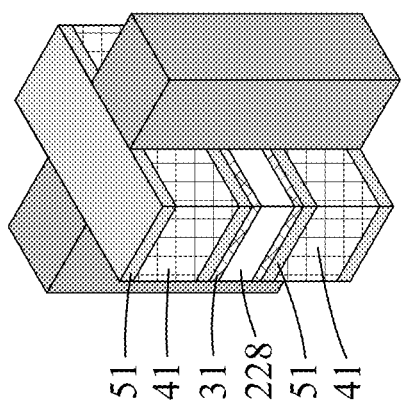
Figure 10A:
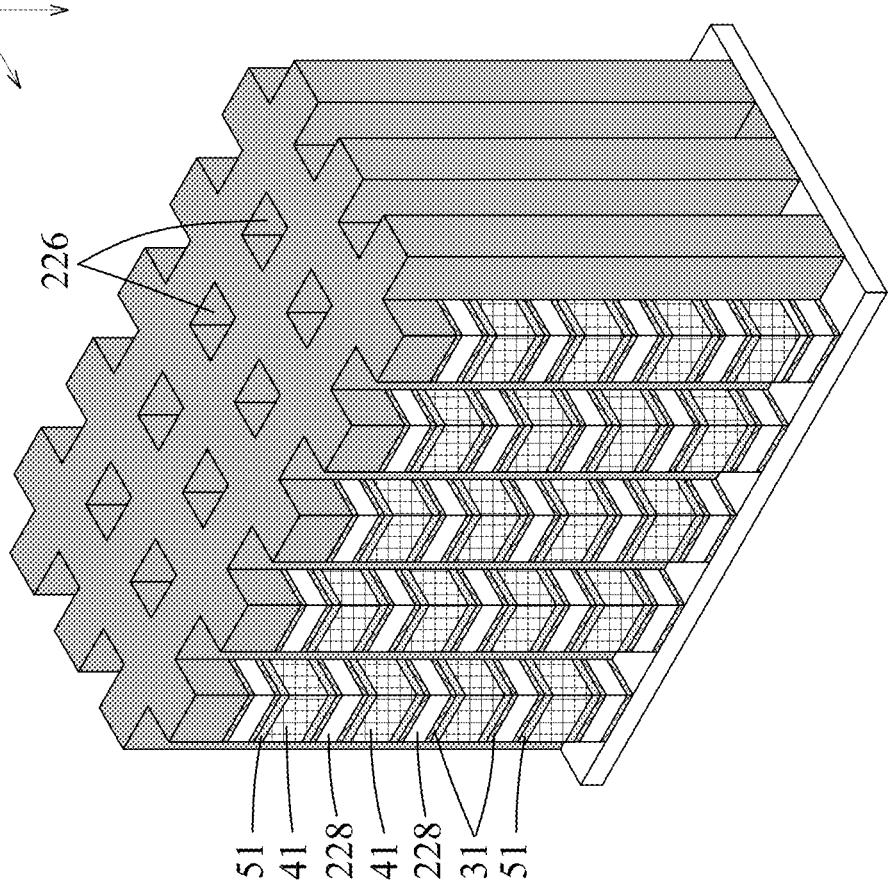

Referring to FIG. 1 and the example illustrated in FIGS. 10A and 10B, the method 100 then proceeds to step 109, where a plurality of memory elements and a plurality of first conductive lines are formed. FIG. 10A illustrates a configuration subsequent to that shown in FIG. 9A, and FIG. 10B is a schematic perspective view of a portion of the configuration shown in FIG. 10A. A memory layer is conformally deposited and a conductive material is filled into the third elongated slots 226 and the fifth elongated slots 229 independently by a suitable deposition technique known to those skilled in the art of semiconductor fabrication, for example, but not limited to, CVD, ALD, PVD, PECVD, or the like. Other suitable techniques for conformally depositing the memory layer and filling the conductive material are within the contemplated scope of the disclosure.

In some embodiments, the memory layer may be made of a high-k dielectric material. In some embodiments, the memory layer may include, for example, but not limited to, a ferroelectric material, silicon nitride, silicon oxynitride, silicon oxide, or the like. The ferroelectric material may be binary oxides such as hafnium oxide (hafnia, $HfO_2$), ternary oxides such as hafnium silicate ($HfSiO_x$), hafnium zirconate ($HfZrO_x$), barium titanate ($BaTiO_3$), lead titanate ($PbTiO_3$), strontium titanate ($SrTiO_3$), calcium manganite ($CaMnO_3$), bismuth ferrite ($BiFeO_3$), or the like, or quaternary oxides such as barium strontium titanate ($BaSrTiO_x$), or the like, or combinations thereof. In some embodiments, the memory layer may have a multi-layered structure. Other materials suitable for the memory layer are within the contemplated scope of the disclosure.

In some embodiments, the conductive material may include, for example, but not limited to, aluminum, zirconium, titanium, tungsten, tantalum, ruthenium, palladium, platinum, cobalt, nickel, or the like, or alloys thereof. Other materials suitable for the conductive material are within the contemplated scope of the disclosure.

Portions of the memory layer and portions of the conductive material in the third elongate slots 226 are removed using a suitable etching process, for example, but not limited to, a wet etching process, a dry etching process, or the like, to form a plurality of first conductive lines 41 in an array arrangement and a plurality of memory elements 51 in an array arrangement. The first conductive lines 41 in the array arrangement are elongated in the Y direction. An array of the first conductive lines 41 includes a plurality of columns of the conductive lines 41 spaced apart from each other in the X direction. The first conductive lines 41 in each of the columns are disposed to alternate with the second dielectric bars 228 of a corresponding one column of the second dielectric bars 228 in the Z direction. The memory elements 51 in the array arrangement are elongated in the Y direction. An array of the memory elements 51 includes a plurality of columns of the memory elements 51 spaced apart from each other in the X direction. The memory elements 51 in each of the columns and the channel features 31 in a corresponding one of the columns are disposed to alternate and in contact with each other.

Figure 11B:
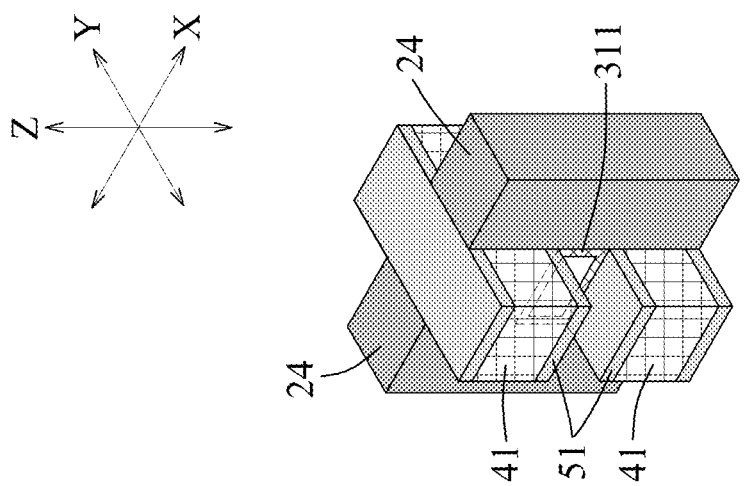
Figure 11A:
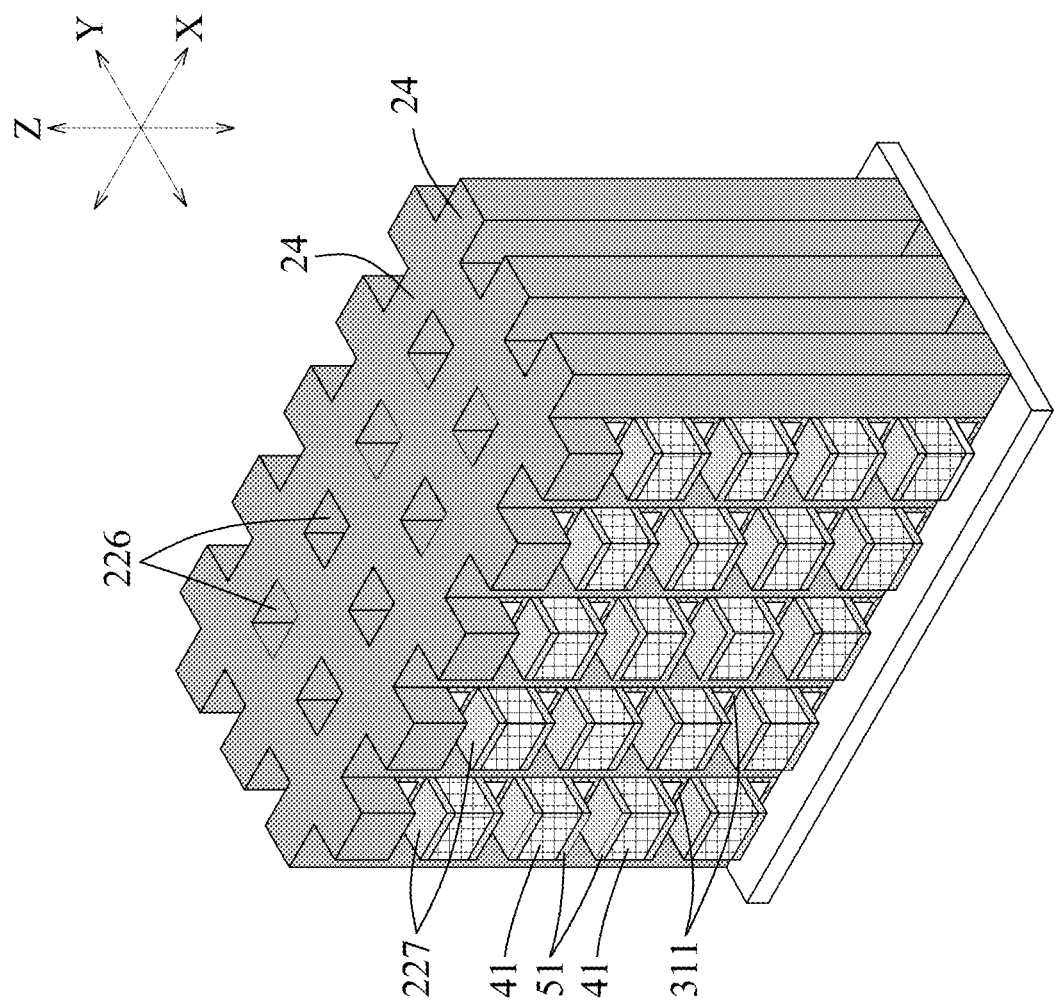

Referring to FIG. 1 and the example illustrated in FIGS. 11A and 11B, the method 100 then proceeds to step 110, where a plurality of channel elements are formed. FIG. 11A illustrates a configuration subsequent to that shown in FIG. 10A, and FIG. 11B is a schematic perspective view of a portion of the configuration shown in FIG. 11A. The second dielectric bars 228 and the second channel regions 312 are removed using a suitable etching process, for example, but not limited to, a wet etching process, a dry etching process, or the like, to form a plurality of channel elements 311 (i.e., the first channel regions 311) in a three dimensional (3D) array arrangement and to reopen the third and fourth elongated slots 226, 227. In some embodiments, the second channel regions 312 are removed completely. In some embodiments, the second channel regions 312 are removed incompletely. In some embodiments, portions of the first channel regions 311 proximate to the second channel regions 312 may also be removed in addition to complete removal of the second channel regions 312.

A 3D array of the channel elements 311 includes a plurality of two dimensional (2D) arrays of the channel elements 311 spaced apart from each other in the X direction. Each of the 2D arrays of the channel elements 311 includes a plurality of columns of the channel elements 311 spaced apart from each other in the Z direction, and the channel elements 311 in each of the columns of each of the 2D arrays of the channel elements 311 are spaced apart from each other in the Y direction. Each of the fourth elongated slots 227 passes through the channel elements 311 arranged in a corresponding one column. Each of the channel elements 311 is in contact with two corresponding ones of the dummy pillars 24 and two corresponding ones of the memory elements 51.

Figure 12B:
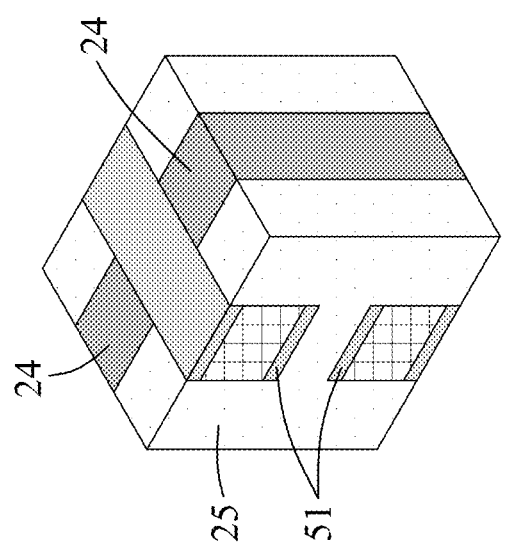
Figure 12A:
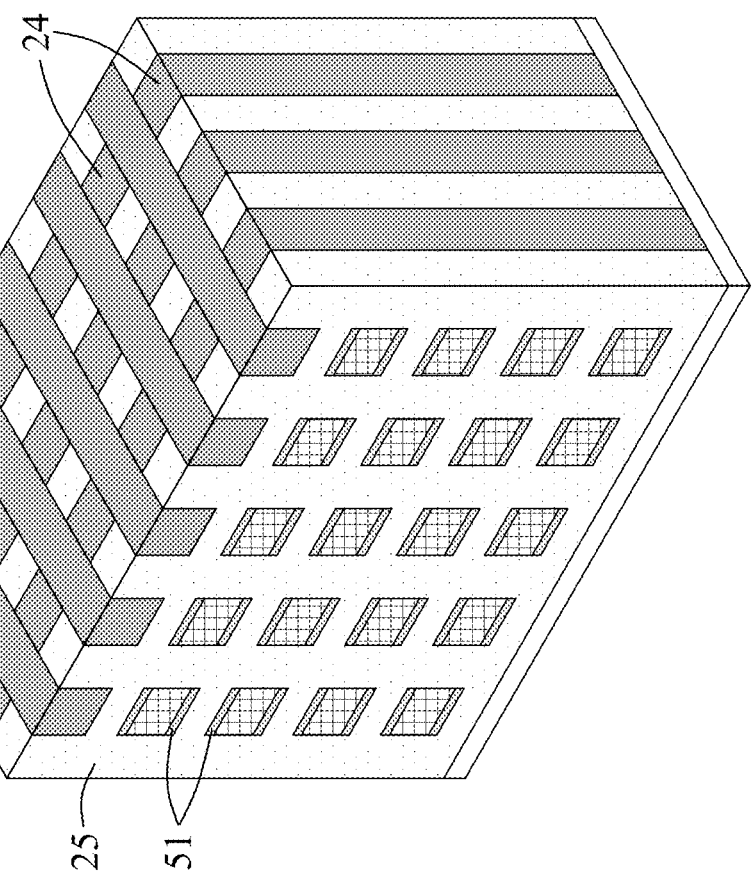

Referring to FIG. 1 and the example illustrated in FIGS. 12A and 12B, the method 100 then proceeds to step 111, where a plurality of air gaps are formed. FIG. 12A illustrates a configuration subsequent to that shown in FIG. 11A, and FIG. 12B is a schematic perspective view of a portion of the configuration shown in FIG. 12A. The third and fourth elongated slots 226, 227 shown in FIG. 11A are filled with a dielectric material 25 by a suitable deposition technique known to those skilled in the art of semiconductor fabrication, for example, but not limited to, CVD, ALD, PVD, PECVD, or the like, such that air gaps 32 are formed in the channel elements 311, as shown in FIGS. 17B, 18B, 19, and 20. Other suitable techniques for filling the dielectric material 25 are within the contemplated scope of the disclosure. In some embodiments, the air gaps 32 may be additionally formed in the dielectric material 25 filled among the dummy pillars 24 and/or in the dielectric material 25 filled between two adjacent ones of the memory elements 51 of each of the columns of the memory elements 51. In some embodiments, the dielectric material 25 for filling the third and fourth elongated slots 226, 227 may include, for example, but not limited to, silicon nitride, silicon nitride doped with carbon, silicon oxide, silicon oxynitride, silicon oxynitride doped with carbon, amorphous carbon material, silicon carbide, other nitride materials, other carbide materials, other low-k dielectric materials or low-k dielectric materials doped with one or more of carbon, nitrogen, and hydrogen, or other suitable materials.

Figure 13B:
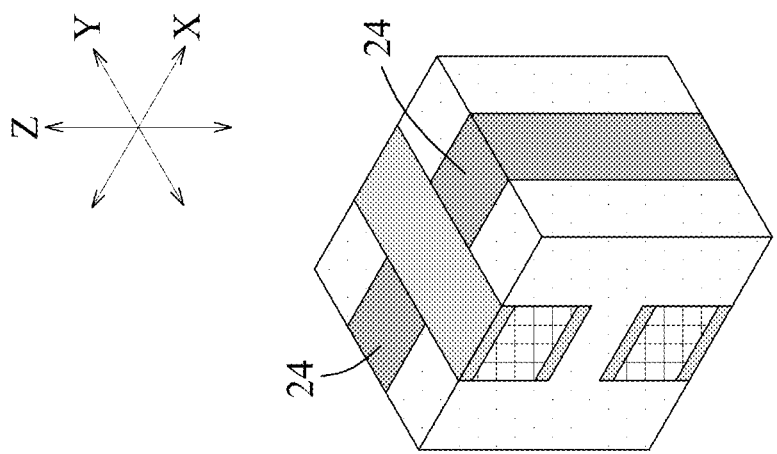
Figure 13A:
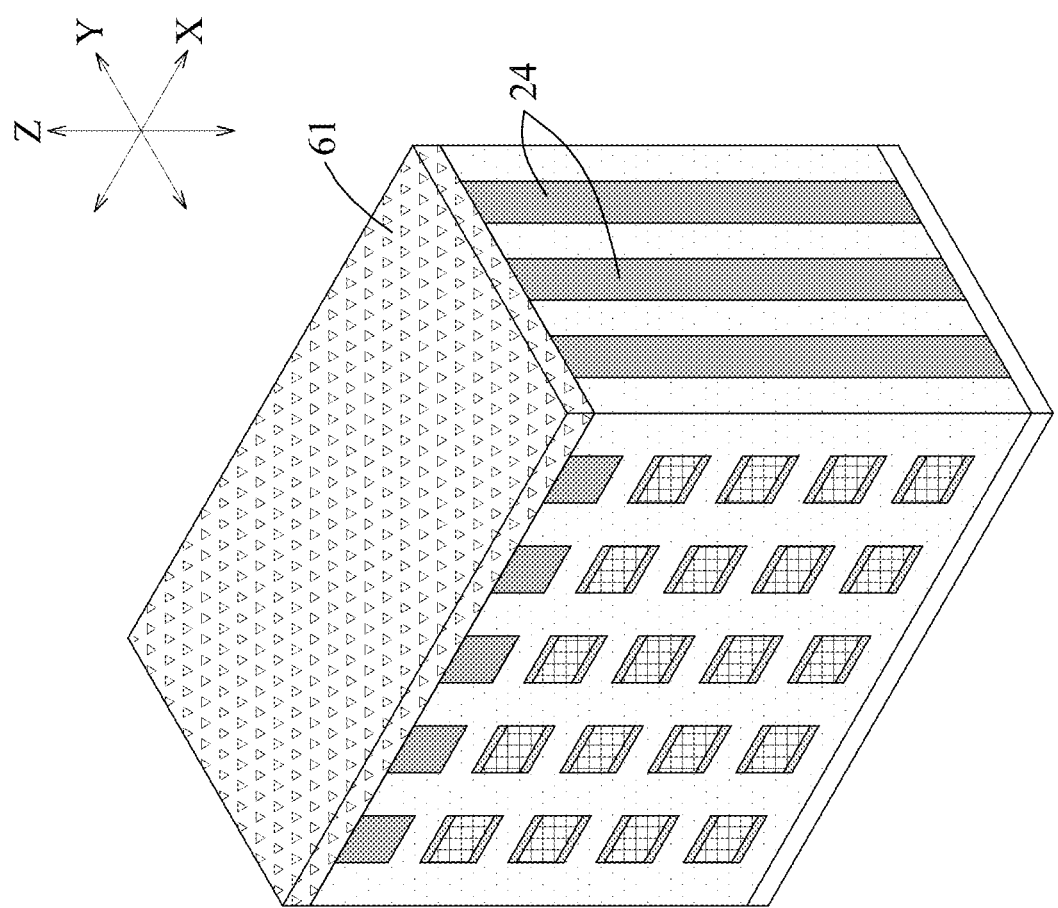

Referring to FIG. 1 and the example illustrated in FIGS. 13A and 13B, the method 100 then proceeds to step 112, where a passivation layer is formed. FIG. 13A illustrates a configuration subsequent to that shown in FIG. 12A, and FIG. 13B is a schematic perspective view of a portion of the configuration shown in FIG. 13A. A passivation layer 61 is formed on the configuration shown in FIG. 12A by a suitable deposition technique known to those skilled in the art of semiconductor fabrication, for example, but not limited to, CVD, ALD, PVD, PECVD, or the like. Other suitable techniques for forming the passivation layer 61 are within the contemplated scope of the disclosure. The passivation layer 61 may include a dielectric material, for example, but not limited to, silicon nitride, silicon nitride doped with carbon, silicon oxide, silicon oxynitride, silicon oxynitride doped with carbon, amorphous carbon material, silicon carbide, other nitride materials, other carbide materials, or combination thereof, and has an etching selectivity different from those of the dielectric materials for forming the air gaps 32 and the dummy features 24. Other materials suitable for the passivation layer 61 are within the contemplated scope of the disclosure.

Figure 14B:
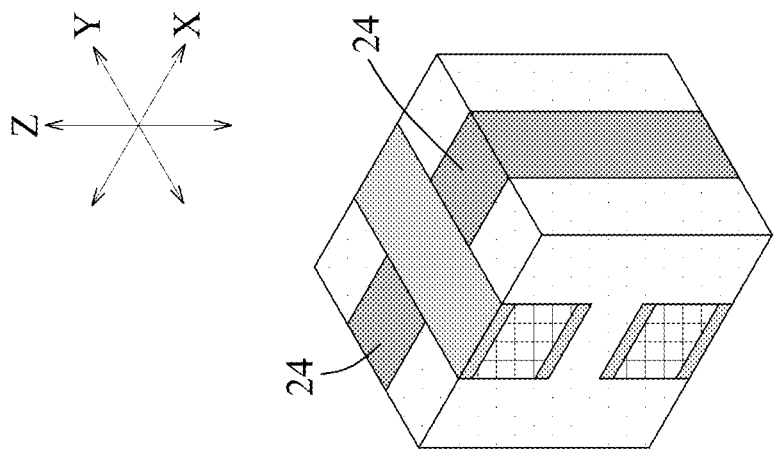
Figure 14A:
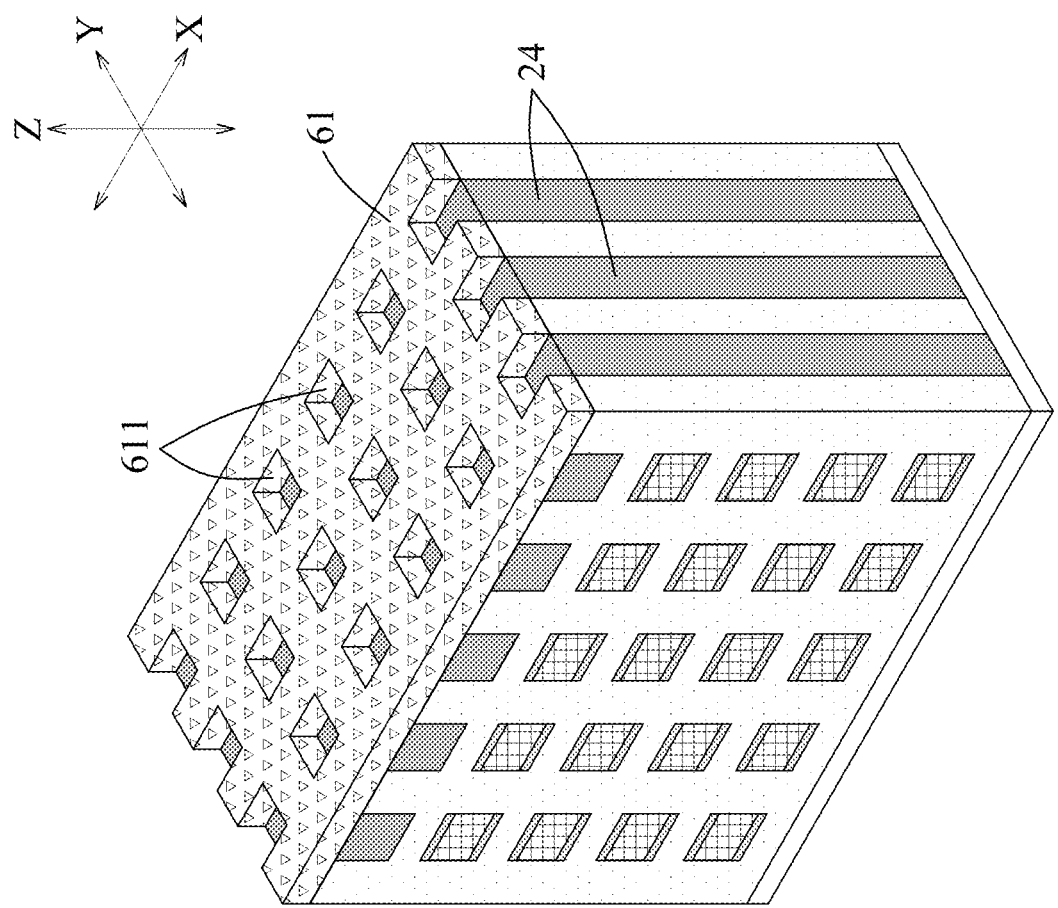

Referring to FIG. 1 and the example illustrated in FIGS. 14A and 14B, the method 100 then proceeds to step 113, where the passivation layer is patterned. FIG. 14A illustrates a configuration subsequent to that shown in FIG. 13A, and FIG. 14B is a schematic perspective view of a portion of the configuration shown in FIG. 14A. The passivation layer 61 is patterned such that a plurality of openings 611 in an array arrangement are formed in the passivation layer 61. In some embodiments, the process for forming an array of the openings 611 in the passivation layer 61 is the same or similar to that for forming the openings 231 in the dummy layer 23 described above, and details thereof are omitted for the sake of brevity. The openings 611 in the array arrangement extend through the passivation layer 61, and are arranged in position corresponding to the dummy pillars 24.

Figure 15B:
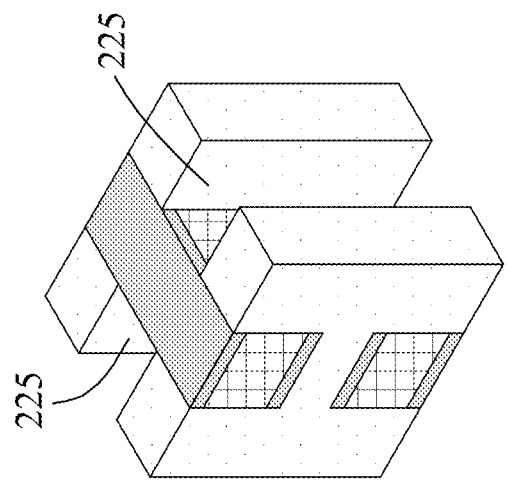
Figure 15A:
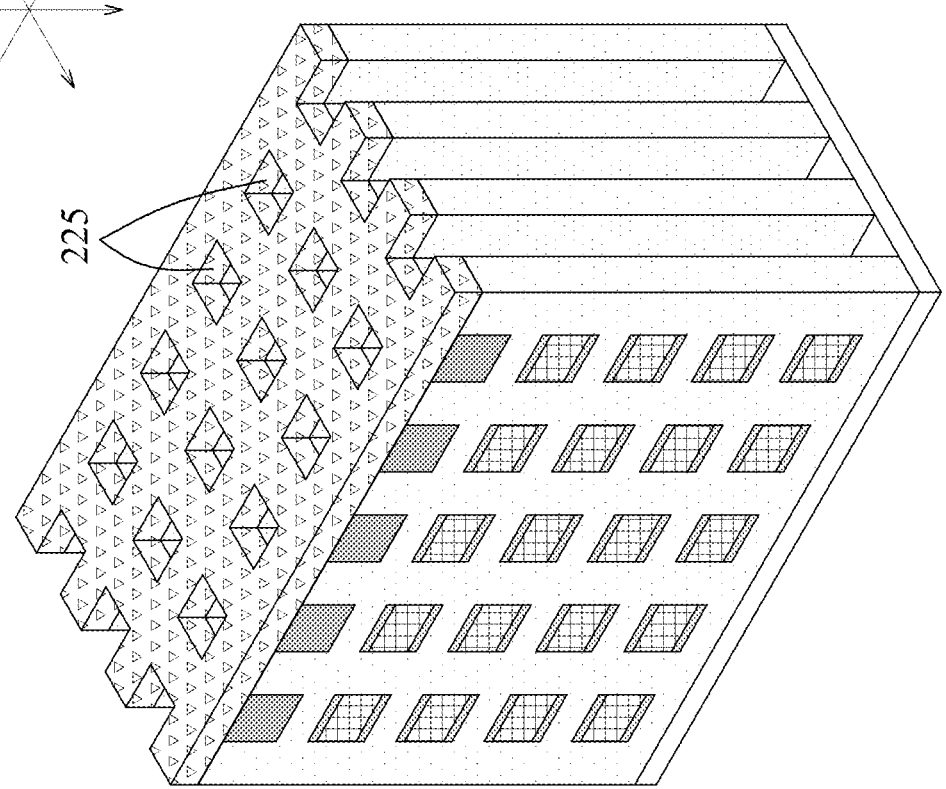

Referring to FIG. 1 and the example illustrated in FIGS. 15A and 15B, the method 100 then proceeds to step 114, where the second elongated slots are reopened. FIG. 15A illustrates a configuration subsequent to that shown in FIG. 14A, and FIG. 15B is a schematic perspective view of a portion of the configuration shown in FIG. 15A. The dummy pillars 24 shown in FIG. 14A are removed using a suitable etching process, for example, but not limited to, a wet etching process, a dry etching process, or the like, through the openings 611 of the passivation layer 61 shown in FIG. 14A, such that the second elongated slots 225 are reopened.

Figure 16B:
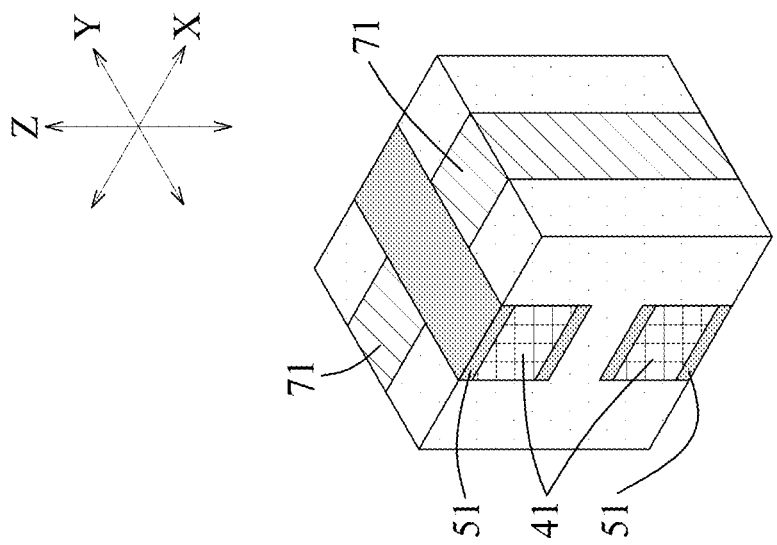
Figure 16A:
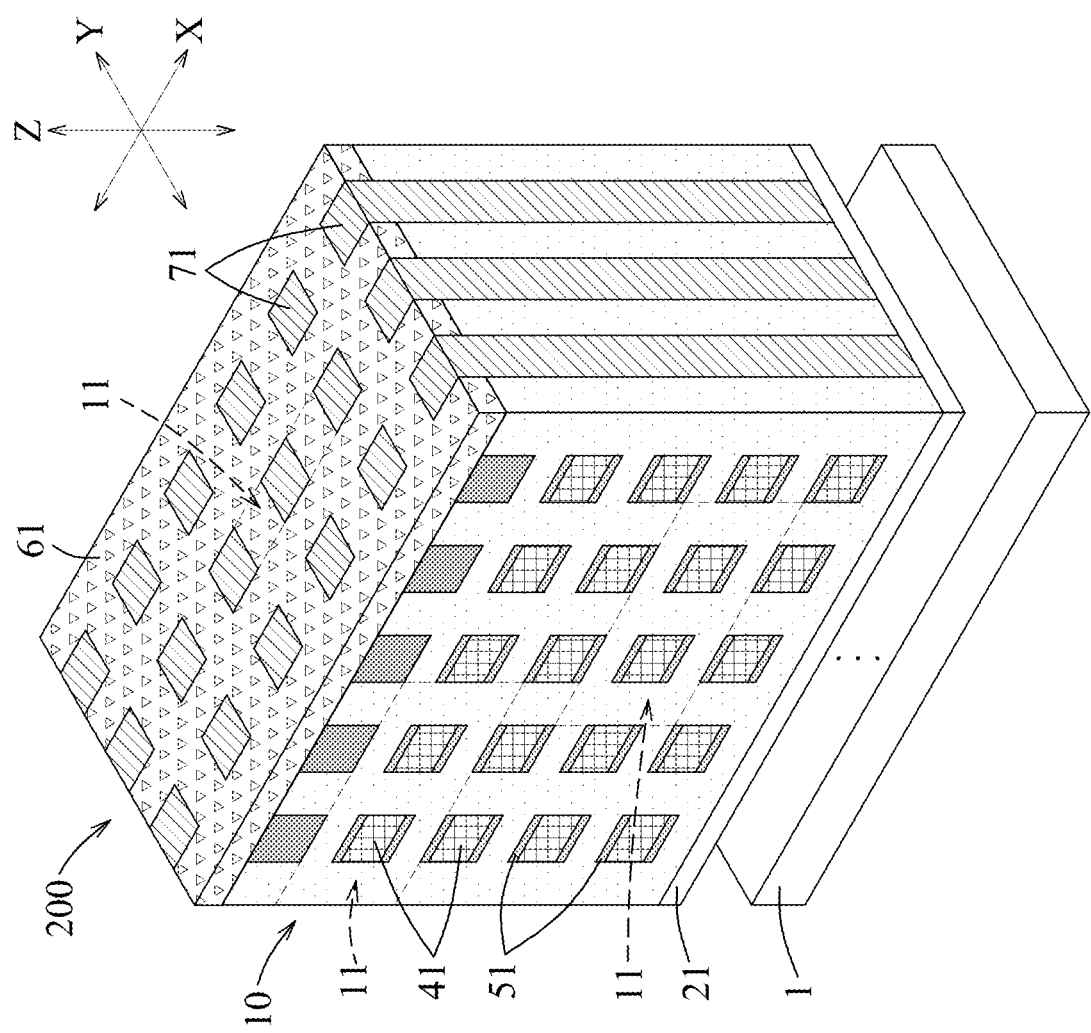
Figure 17A:
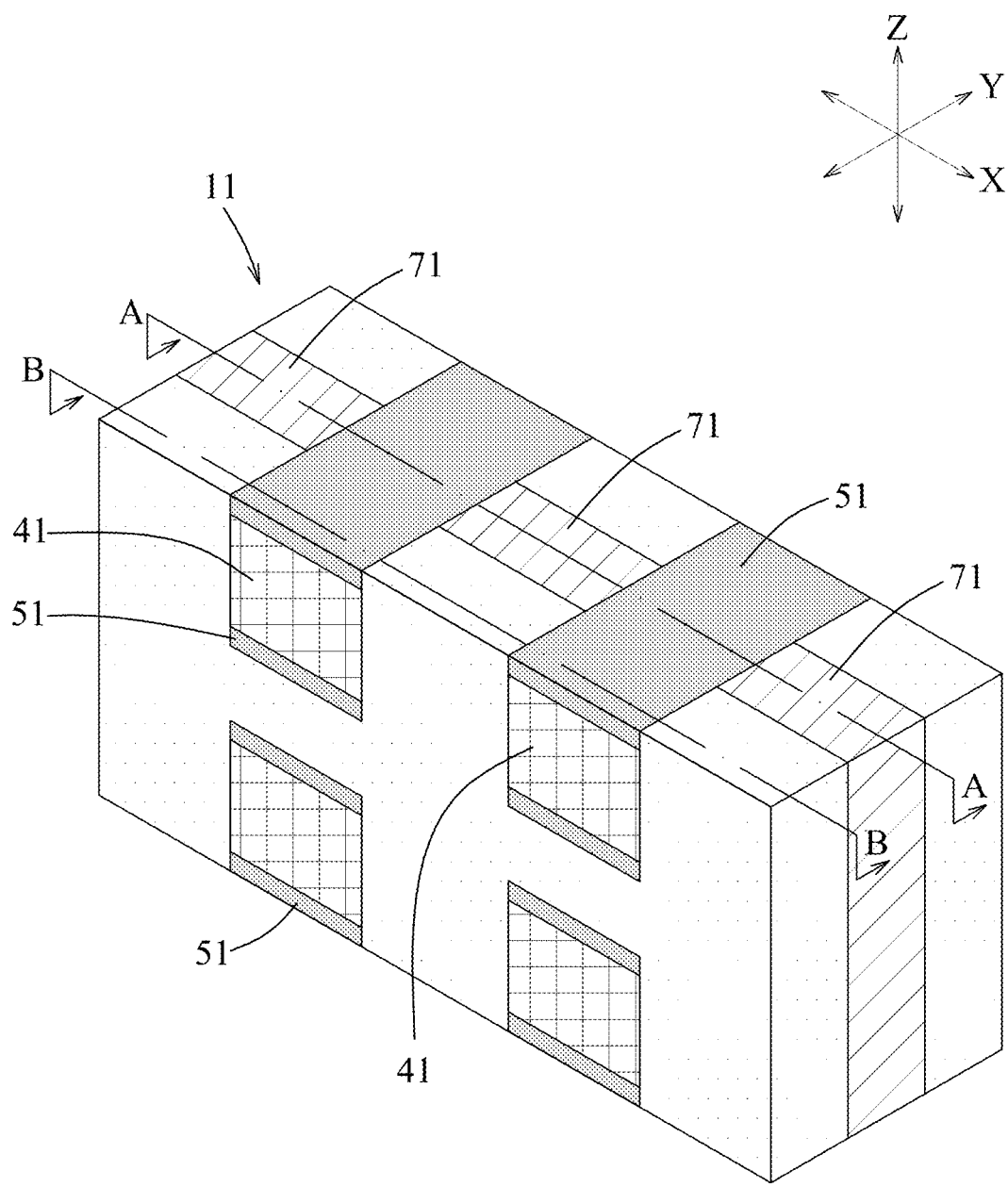
FIG. 17A is a schematic perspective view illustrating a portion of the semiconductor device shown in FIG. 16A.
Figure 17B:
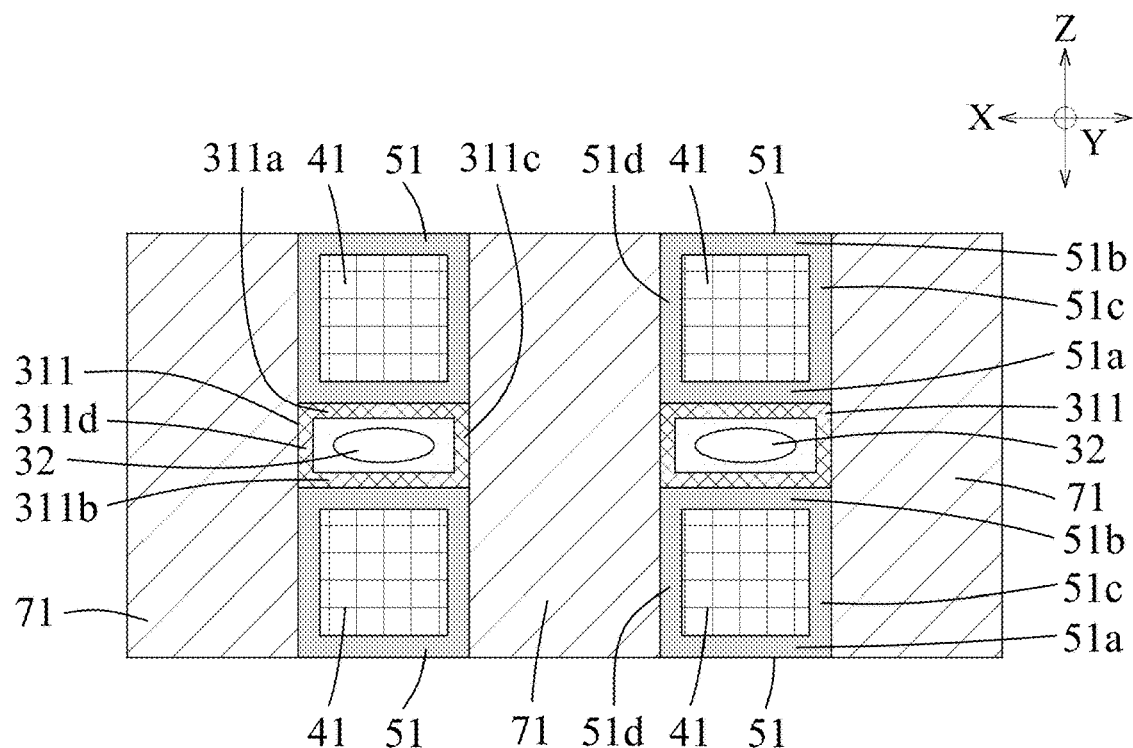
FIG. 17B is a schematic sectional view of the portion of the semiconductor device taken along line A-A of FIG. 17A.
Figure 17C:
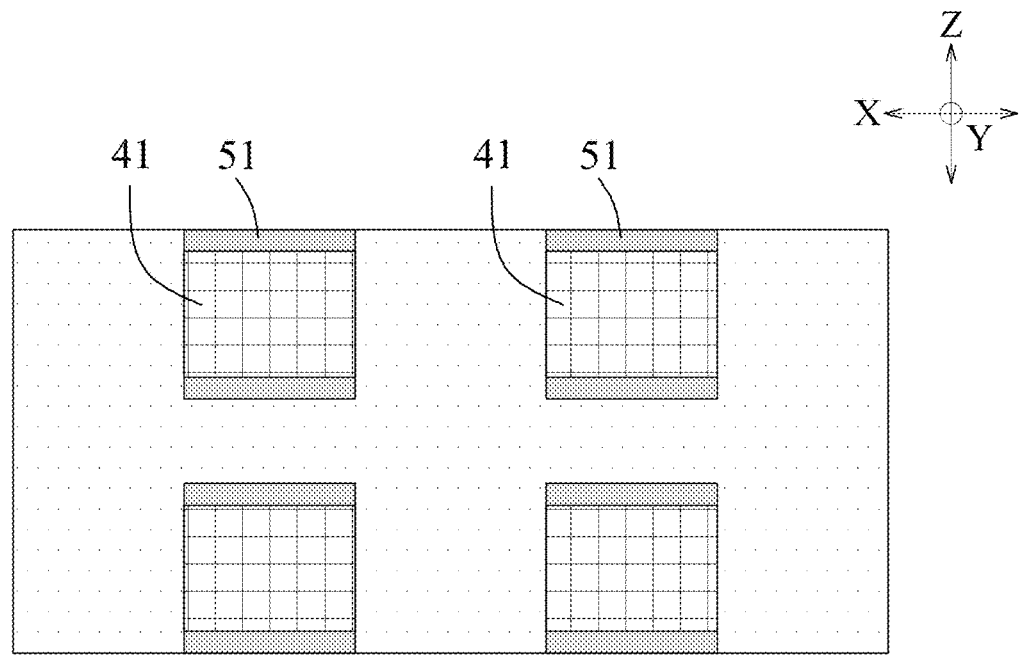
FIG. 17C is another schematic sectional view of the portion of the semiconductor device taken along line B-B of FIG. 17A.

Referring to FIG. 1 and the example illustrated in FIGS. 16A and 16B, the method 100 then proceeds to step 115, where a plurality of second conductive lines are formed. FIG. 16A illustrates a configuration subsequent to that shown in FIG. 15A, and FIG. 16B is a schematic perspective view of a portion of the configuration shown in FIG. 16A. A conductive material is filled into the second elongated slots 225 shown in FIG. 15A using a suitable deposition technique, for example, but not limited to, CVD, PECVD, or the like. Other suitable techniques for filling the conductive material are within the contemplated scope of the present disclosure. The conductive material may include aluminum, zirconium, titanium, tungsten, tantalum, ruthenium, palladium, platinum, cobalt, nickel, or the like, or alloys thereof. Other conductive materials suitable for filling the second elongated slots 225 are within the contemplated scope of the present disclosure. After filling of the conductive material, a planarization process, such as CMP, is performed to remove an excess of the conductive material above the passivation layer 61 and to form a plurality of second conductive lines 71 in an array arrangement. Other suitable processes for planarizing the conductive material are within the contemplated scope of the disclosure. The second conductive lines 71 in the array arrangement are elongated in the Z direction to terminate the etch stop layer 21. An array of the second conductive lines 71 includes a plurality of columns of the second conductive lines 71 spaced apart from each other in the X direction. The second conductive lines 71 in each of the columns are spaced apart from each other in the Y direction. Accordingly, an embodiment of the semiconductor device 200 of the present disclosure is obtained.

Referring to the examples illustrated in FIGS. 16A and 17A to 17C, the semiconductor device 200 includes a three-dimensional (3D) memory structure 10 disposed over the substrate 1. The 3D memory structure 10 includes a plurality of memory cells 11 arranged in the three directions (i.e., the X, Y, and Z directions) which are transverse to one another. In some embodiments, the three directions are perpendicular to one another. In some embodiments, the 3D memory structure 10 is located in the back-end of line (BEOL), while in certain embodiments, the 3D memory structure 10 may be located in the front-end of line (FEOL).

The 3D memory structure 10 includes a plurality of the first conductive lines 41, a plurality of the second conductive lines 71, a plurality of the memory elements 51, and a plurality of the channel elements 311. As described above, the first conductive lines 41 are elongated in the Y direction, and are disposed in an array arrangement. An array of the first conductive lines 41 includes a plurality of columns of the first conductive lines 41 spaced apart from each other in the X direction, and the first conductive lines 41 in each of the columns are spaced apart from each other in the Z direction. Each of the first conductive lines 41 serves as a word line. The second conductive lines 71 are elongated in the Z direction, and are disposed in an array arrangement. An array of the second conductive lines 71 includes a plurality of columns of the second conductive lines 71 spaced apart from each other in the X direction, and the second conductive lines 71 in each of the columns are spaced apart from each other in the Y direction. Each of the second conductive lines 71 serves as a source line or a bit line. The memory elements 51 are elongated in the Y direction, and are disposed in an array arrangement. An array of the memory elements 51 includes a plurality of columns of the memory elements 51 spaced apart from each other in the X direction, and the memory elements 51 in each of the columns are spaced part from each other in the Z direction. The channel elements 311 are disposed in a 3D array arrangement. A 3D array of the channel elements 311 includes a plurality of 2D arrays of the channel elements 311 spaced apart from each other in the X direction. Each of the 2D arrays of the channel elements 311 includes a plurality of columns of the channel elements 311 spaced apart from each other in the Z direction, and the channel elements 311 in each of the columns of each of the 2D arrays of the channel elements 311 are spaced apart from each other in the Y direction.

Each of the channel elements 311 is disposed between two corresponding ones of the first conductive lines 41 which are spaced apart from each other in the Z direction, and is formed with an air gap 32 therein. Two corresponding ones of the memory elements 51 are disposed at two opposite sides of the each of the channel elements 311 in the Z direction, such that the two corresponding ones of the memory elements 51 are disposed to surround the two corresponding ones of the first conductive lines 41, respectively, and to separate each of the two corresponding ones of the first conductive lines 41 from the each of the channel elements 311. Two corresponding ones of the second conductive lines 71 are disposed at two opposite sides of the each of the channel elements 311 in the X direction, such that each of the two corresponding ones of the second conductive lines 71 is in contact with the each of the channel elements 311 and the two corresponding ones of the memory elements 51.

The each of the channel elements 311 includes an upper channel portion 311a and a lower channel portion 311b, which are spaced apart from each other by the air gap 32 and which are in contact with the two corresponding ones of the memory elements 51, respectively, and a first side channel portion 311c and a second side channel portion 311d, which are spaced apart from each other by the air gap 32 and which are in contact with the two corresponding ones of the second conductive lines 71, respectively.

An upper one of the two corresponding ones of the memory elements 51 includes a lower memory portion 51a in contact with the each of the channel elements 311, an upper memory portion 51b spaced apart from the lower memory portion 51a by an upper one of the two corresponding ones of the first conductive lines 41, and a first side memory portion 51c and a second side memory portion 51d which are spaced apart from each other by the upper one of the two corresponding ones of the first conductive lines 41 and which are in contact with the two corresponding ones of the second conductive lines 71, respectively.

A lower one of the two corresponding ones of the memory elements 51 includes an upper memory portion 51b in contact with the each of the channel elements 311, a lower memory portion 51a spaced apart from the upper memory portion 51b by a lower one of the two corresponding ones of the first conductive lines 41, and a first side memory portion 51c and a second side memory portion 51d which are spaced apart from each other by the lower one of the two corresponding ones of the first conductive lines 41 and which are in contact with the two corresponding ones of the second conductive lines 71, respectively.

Figure 18A:
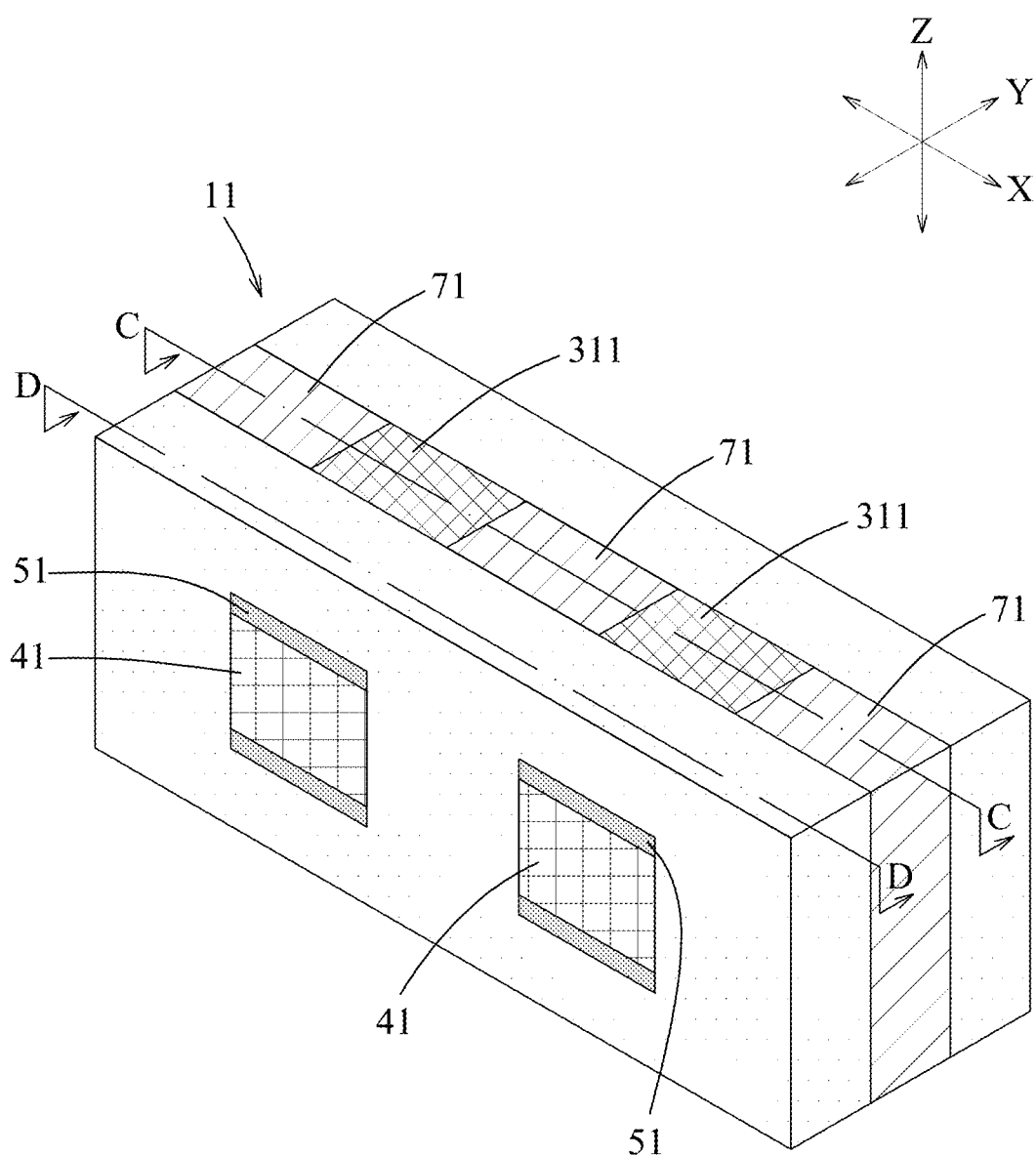
FIG. 18A is a schematic perspective view illustrating another portion of the semiconductor device shown in FIG. 16A.
Figure 18B:
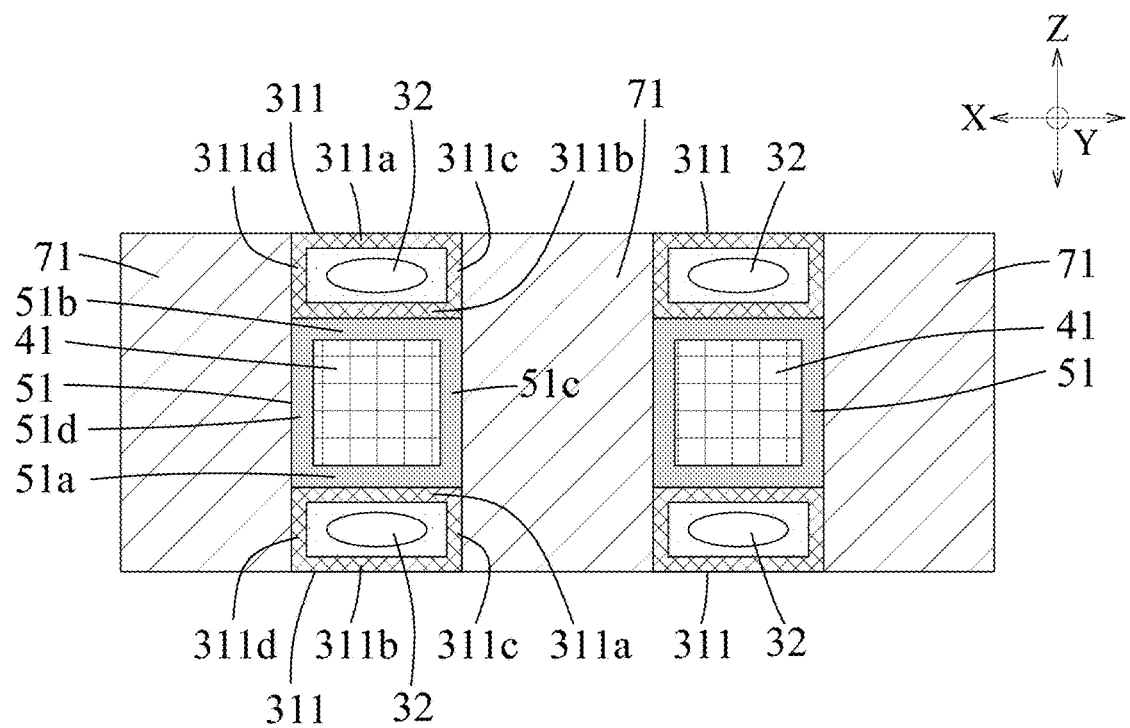
FIG. 18B is a schematic sectional view of the another portion of the semiconductor device taken along line C-C of FIG. 18A.
Figure 18C:
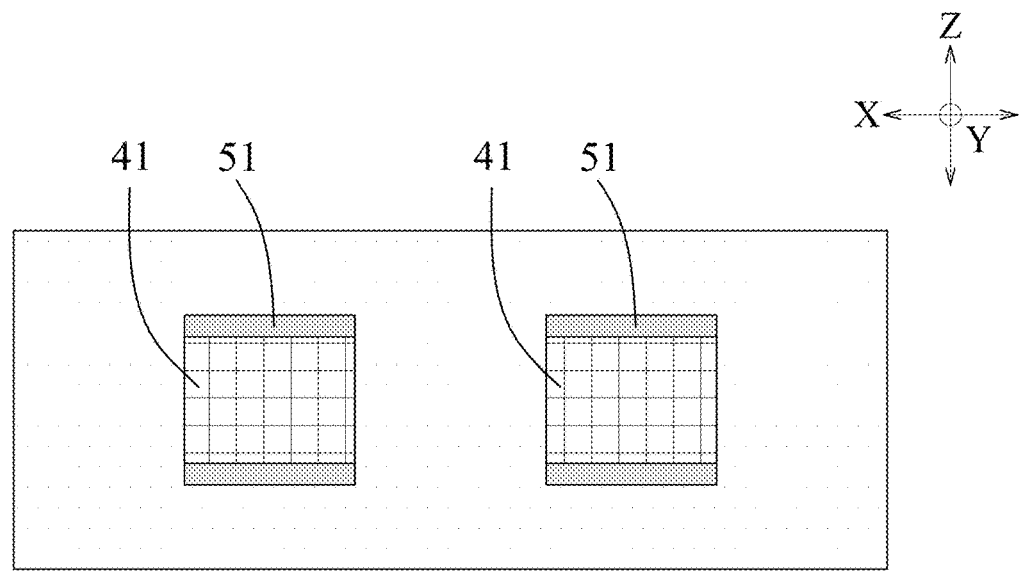
FIG. 18C is another schematic sectional view of the another portion of the semiconductor device taken along line D-D of FIG. 18A.

In addition, referring to the examples illustrated in FIGS. 18A to 18C, each of the first conductive lines 41 is disposed between two corresponding ones of the channel elements 311 which are spaced apart from each other in the Z direction. Each of the memory elements 51 is disposed to surround the each of the first conductive lines 41 and to separate each of the two corresponding ones of the channel elements 311 from the each of the first conductive lines 41. Two corresponding ones of the second conductive lines 71 are disposed at two opposite sides of the each of the memory elements 51 in the X direction, such that each of the two corresponding ones of the second conductive lines 71 is in contact with the each of the memory elements 51 and the two corresponding ones of the channel elements 311.

Each of the memory elements 51 includes a lower memory portion 51a in contact with a lower one of the two corresponding ones of the channel elements 311, an upper memory portion 51b which is spaced apart from the lower memory portion 51a by the each of the first conductive lines 41 and which is in contact with an upper one of the two corresponding ones of the channel elements 311, and a first side memory portion 51c and a second side memory portion 51d which are spaced apart from each other by the each of the first conductive lines 41 and which are in contact with the two corresponding ones of the second conductive lines 71, respectively.

An upper one of the two corresponding ones of the channel elements 311 includes an upper channel portion 311a, a lower channel portion 311b spaced apart from the upper channel portion 311a by the air gap 32 and in contact with the each of the memory elements 51, and a first side channel portion 311c and a second side channel portion 311d, which are spaced apart from each other by the air gap 32 and which are in contact with the two corresponding ones of the second conductive lines 71, respectively.

A lower of the two corresponding ones of the channel elements 311 includes an upper channel portion 311a in contact with the each of the memory elements 51, a lower channel portion 311b spaced apart from the upper channel portion 311a by the air gap 32, and a first side channel portion 311c and a second side channel portion 311d, which are spaced apart from each other by the air gap 32 and which are in contact with the two corresponding ones of the second conductive lines 71, respectively.

Figure 19:
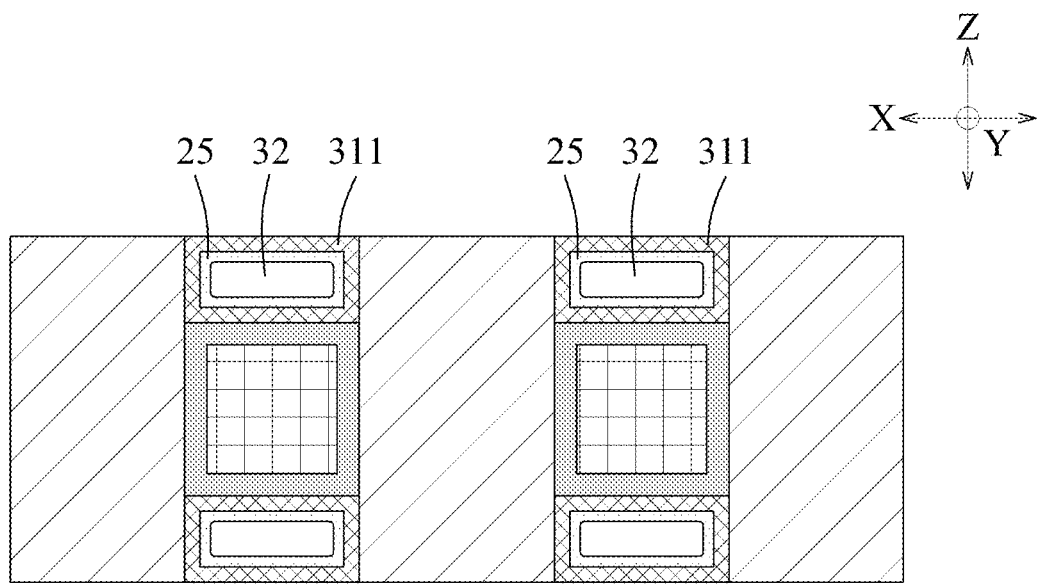
FIG. 19 is a schematic sectional view illustrating a portion of a semiconductor device in accordance with some alternative embodiments.
Figure 20:
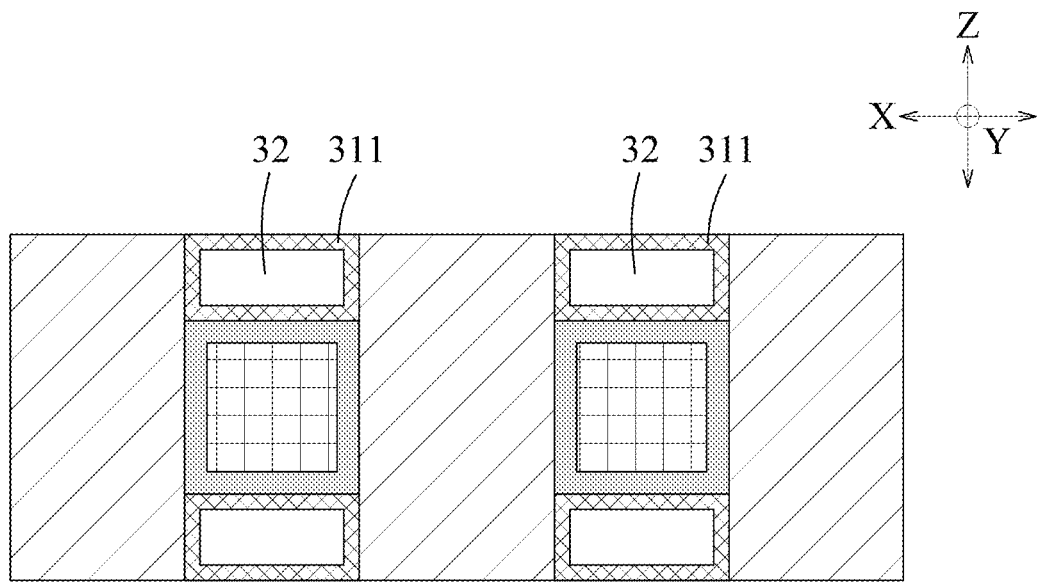
FIG. 20 is a schematic sectional view illustrating a portion of a semiconductor device in accordance with some alternative embodiments.

Referring to the examples illustrated in FIGS. 18B, 19, and 20, the air gaps 32 formed in the channel elements 311 may have various geometric shapes in cross-section, such as a circular-like shape shown in FIG. 18B, a rectangular-like shape shown in FIGS. 19, 20, or the like. In addition, in some embodiments, the dielectric material 25 filled for forming the air gaps 32 may be deposited on inner surfaces of the channel elements 311 to form dielectric layers on the inner surfaces of the channel elements 311 so as to confine the air gaps 32 as shown in FIGS. 18B and 19. In some alternative embodiments, the air gaps 32 are directly confined by the channel elements 311 without formation of the dielectric layers on the inner surfaces of the channel elements 311 as shown in FIG. 20.

Figure 21:
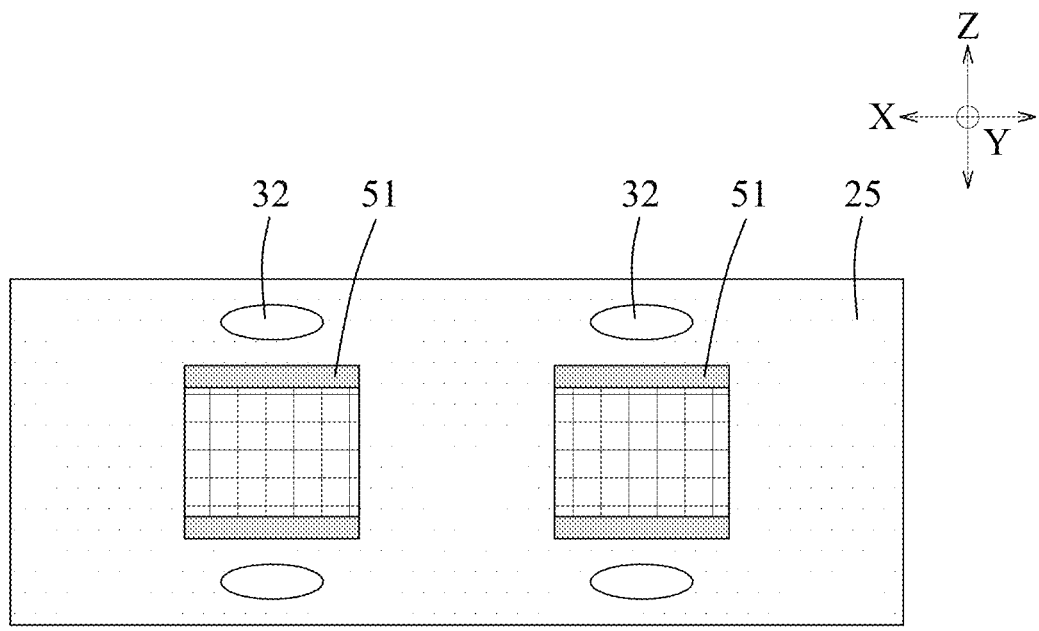
FIG. 21 is a schematic sectional view illustrating a portion of a semiconductor device in accordance with some alternative embodiments.
Figure 22:
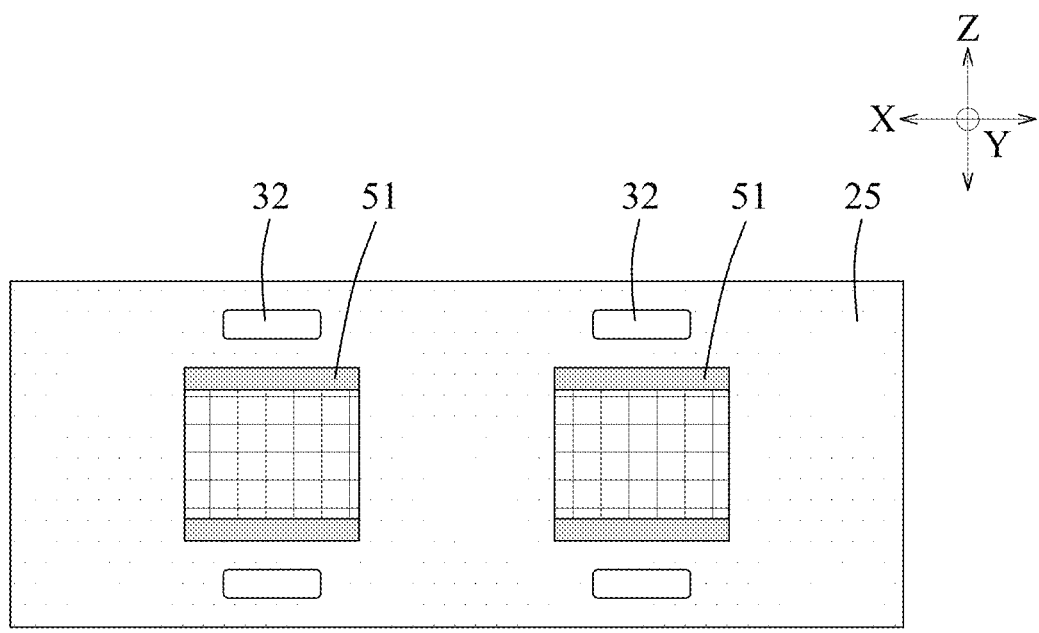
FIG. 22 is a schematic sectional view illustrating a portion of a semiconductor device in accordance with some alternative embodiments.

Referring to the examples illustrated in FIGS. 21 and 22, the air gaps 32 may be additionally formed in portions of the dielectric material 25 filled among the memory elements 51. The air gaps 32 formed in the portions of the dielectric material 25 filled among the memory elements 51 may also have various geometric shapes in cross-section, such as a circular-like shape shown in FIG. 21, a rectangular-like shape shown in FIG. 22, or the like.

Figure 23:
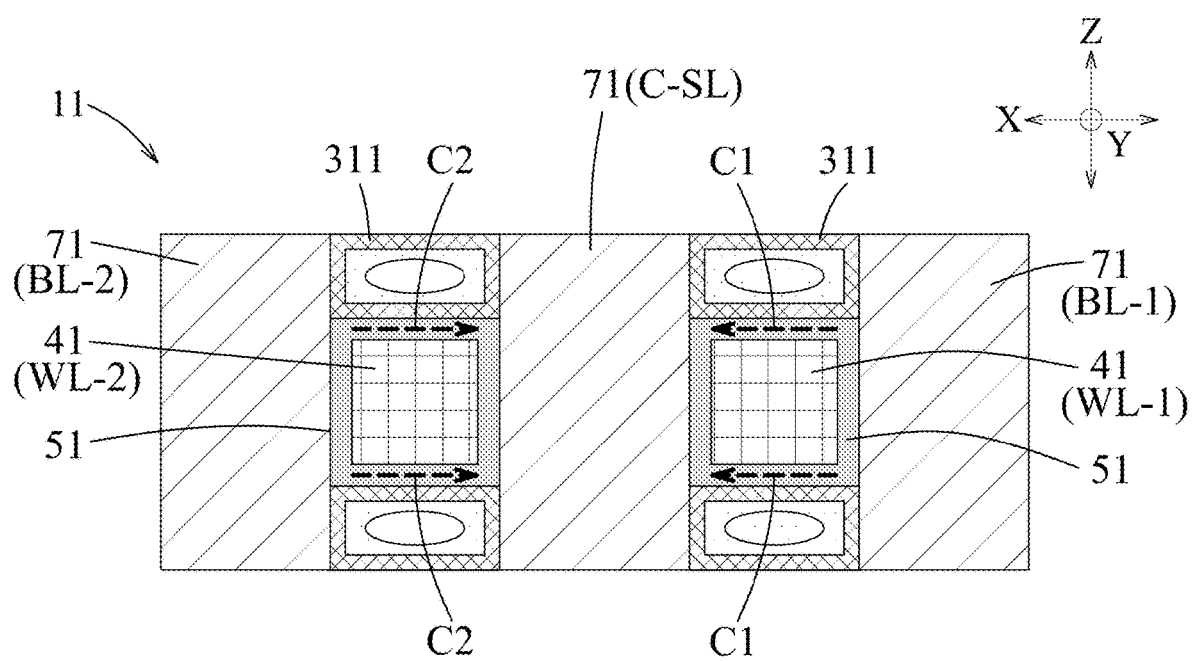
FIG. 23 is a schematic sectional view illustrating the operation of the semiconductor device in accordance with some embodiments.

Referring to the example shown in FIG. 23, each of the memory cells 11 includes portions of three of the second conductive lines 71, portions of two of the first conductive lines 41 disposed to alternate with the three of the second conductive lines 71, portions of two of the memory elements 51 respectively surrounding the two of the first conductive lines 41, four of the channel elements 311 in an arrangement of a two by two array. Two columns of the channel elements 311 are spaced apart from each other by a middle one of the three of the second conductive lines 71. The channel elements 311 in each of the two columns are spaced apart from each other in the Z direction, and are in contact with a corresponding one of the two of the memory elements 51. The middle one of the three of the second conductive lines 71 serves as a common source line (C-SL), and remaining two ones of the three of the second conductive lines 71 serve as bit lines (BL1, BL2), respectively. The two of the first conductive lines 41 serve as word lines (WL1, WL2), respectively. When the data read out in the word line (WL1) is 1 with the application of a suitable voltage, the data read out in the word line (WL2) is 0 without the application of a voltage, the data read out in the bit line (BL1) is 1 with the application of a suitable voltage, the data read out in the bit line (BL2) is 0 without the application of a voltage, and the common source line (C-SL) is grounded, channels (C1, i.e., the channel portions of the channel elements 311 proximate to the word line (WL1)) are turned on to permit currents to flow from the bit line (BL1) to the common source line (C-SL) through the channels (C1). When the data read out in the word line (WL1) is 0 without the application of a voltage, the data read out in the word line (WL2) is 1 with the application of a suitable voltage, the data read out in the bit line (BL1) is 0 without the application of a voltage, the data read out in the bit line (BL2) is 1 with the application of a suitable voltage, and the common source line (C-SL) is grounded, channels (C2, i.e., the channel portions of the channel elements 311 proximate to the word line (WL2)) are turned on to permit currents to flow from the bit line (BL2) to the common source line (C-SL) through the channels (C2).

In the semiconductor device of the present disclosure, the channel elements of the 3D memory structure of the semiconductor device are formed with the air gaps therein. Therefore, a capacitance between two adjacent ones of the word lines disposed at two opposite sides of each of the channel elements can be reduced significantly. In addition, the air gaps may be formed in the dielectric material filled among the second conductive lines serving as the source/bit lines and among the memory elements. Therefore, the total capacitance produced by the 3D memory structure can be further reduced.

In accordance with some embodiments of the present disclosure, a semiconductor device includes a substrate and a memory structure disposed over the substrate. The memory structure includes a pair of first conductive lines, a channel element disposed between the pair of the first conductive lines and formed with an air gap therein, a first memory element disposed to separate one of the pair of the first conductive lines from the channel element, and a second memory element disposed to separate the other one of the pair of the first conductive lines from the channel element.

In accordance with some embodiments of the present disclosure, the memory structure further includes a pair of second conductive lines disposed transversely relative to the pair of the first conductive lines and at two opposite sides of the channel element such that each of the second conductive lines is in contact with the channel element and the first and second memory elements.

In accordance with some embodiments of the present disclosure, the channel element includes an upper channel portion disposed to be in contact with the first memory element, a lower channel portion disposed to be in contact with the second memory element, a first side channel portion disposed to be in contact with one of the second conductive lines, and a second side channel portion disposed to be in contact with the other one of the second conductive lines.

In accordance with some embodiments of the present disclosure, the first memory element surrounds one of the first conductive lines, and includes a lower memory portion disposed to be in contact with the channel element, an upper memory portion disposed on the one of the first conductive lines and opposite to the lower memory portion, a first side memory portion disposed to be in contact with one of the second conductive lines, and a second side memory portion disposed to be in contact with the other one of the second conductive lines.

In accordance with some embodiments of the present disclosure, the second memory element surrounds the other one of the first conductive lines, and includes an upper memory portion disposed to be in contact with the channel element, a lower memory portion disposed on the other one of the first conductive lines and opposite to the upper memory portion, a first side memory portion disposed to be in contact with one of the second conductive lines, and a second side memory portion disposed to be in contact with the other one of the second conductive lines.

In accordance with some embodiments of the present disclosure, the semiconductor device further includes a dielectric layer formed on an inner surface of the channel element to confine the air gap.

In accordance with some embodiments of the present disclosure, each of the first conductive lines serves as a word line.

In accordance with some embodiments of the present disclosure, one of the second conductive lines serves as a source line and the other one of the second conductive lines serves as a bit line.

In accordance with some embodiments of the present disclosure, a semiconductor device includes a substrate and a memory structure disposed over the substrate. The memory structure includes a first channel element and a second chancel element, each of which is formed with an air gap therein, a first conductive line disposed between the first and second channel elements, and a memory element disposed to separate the first conductive line from the first and second channel elements.

In accordance with some embodiments of the present disclosure, the memory structure further includes a pair of second conductive lines disposed transversely relative to the first conductive lines and at two opposite sides of the memory element such that each of the second conductive lines is in contact with the first and second channel elements and the memory element.

In accordance with some embodiments of the present disclosure, the first channel element includes a lower channel portion disposed to be in contact with the memory element, an upper channel portion spaced apart from the lower chancel portion by the air gap, a first side channel portion disposed to be in contact with one of the second conductive lines, and a second side channel portion disposed to be in contact with the other one of the second conductive lines.

In accordance with some embodiments of the present disclosure, the second channel element includes an upper channel portion disposed to be in contact with the memory element, a lower channel portion spaced apart from the upper channel portion by the air gap, a first side channel region disposed to be in contact with one of the second conductive lines, and a second side channel portion disposed to be in contact with the other one of the second conductive lines.

In accordance with some embodiments of the present disclosure, the memory element surrounds the first conductive line, and includes an upper memory portion disposed to be in contact with the first channel element, a lower memory portion disposed to be in contact with the second channel element, a first side memory portion disposed to be in contact with one of the second conductive lines, and a second side memory portion disposed to be in contact with the other one of the second conductive lines.

In accordance with some embodiments of the present disclosure, the first conductive line serves as a word line.

In accordance with some embodiments of the present disclosure, one of the second conductive lines serves as a source line and the other one of the second conductive lines serves as a bit line.

In accordance with some embodiments of the present disclosure, the semiconductor device further includes a dielectric layer formed on an inner surface of each of the first and second channel elements to confine the air gap.

In accordance with some embodiments of the present disclosure, a method for manufacturing a semiconductor device includes: forming a first dielectric pillar having a first wall surface, and a second dielectric pillar having a second wall surface which is spaced apart from the first wall surface; forming a first dummy pillar and a second dummy pillar which are spaced apart from each other and which extend transversely relative to the first and second dielectric pillars, such that the first and second dummy pillars are interconnected with each other through the first and second dielectric pillars, the first dummy pillar having a third wall surface extending to interconnect the first and second dielectric pillars, the second dummy pillar having a fourth wall surface spaced apart from the third wall surface and extending to interconnect the first and second dielectric pillars; conformally forming a channel feature which includes a first channel region disposed between and in contact with the first and second dummy pillars, and a second channel region exposed beyond the first and second dummy pillars; removing the first and second dielectric pillars such that the first and second dummy pillars are interconnected with each other through the channel feature; forming a pair of first conductive lines, a first memory element, and a second memory element, the pair of the first conductive lines being disposed transversely relative to the first and second dummy pillars and opposite to each other relative to the channel feature, each of the first and second memory elements including a first memory portion in contact with the channel feature, a second memory portion spaced apart from the first memory portion by a corresponding one of the first conductive lines, and a third memory portion and a fourth memory portion, each of which extends to interconnect the first and second memory portions and to contact a corresponding one of the first and second dummy pillars and the corresponding one of the first conductive lines; and removing at least a portion of the second channel region to form a channel element having an air gap therein.

In accordance with some embodiments of the present disclosure, the method for manufacturing a semiconductor device further includes: replacing the first and second dummy pillars with a conductive material to form a pair of second conductive lines transversely relative to the first conductive lines.

In accordance with some embodiments of the present disclosure, the method for manufacturing a semiconductor device further includes: forming a dielectric layer on an inner surface of the channel element to confine the air gap.

In accordance with some embodiments of the present disclosure, the dielectric layer is formed by filling a dielectric material into an elongated slot passing through the channel element.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate; and
   a memory structure disposed over the substrate and including:
      a pair of first conductive lines,
      a channel element disposed between the pair of first conductive lines,
      an air gap located in the channel element,
      a first memory element disposed to separate one of the pair of first conductive lines from the channel element, and
      a second memory element disposed to separate the other one of the pair of first conductive lines from the channel element,
      wherein the memory structure further includes a pair of second conductive lines disposed transversely relative to the pair of first conductive lines and at two opposite sides of the channel element such that each of the second conductive lines is in contact with the channel element and the first memory element and the second memory element.

2. The semiconductor device according to claim 1, wherein the channel element includes:
   an upper channel portion disposed to be in contact with the first memory element,
   a lower channel portion disposed to be in contact with the second memory element,
   a first side channel portion disposed to be in contact with one of the second conductive lines in the pair of second conductive lines, and
   a second side channel portion disposed to be in contact with the other one of the second conductive lines in the pair of second conductive lines.

3. The semiconductor device according to claim 1, wherein the first memory element surrounds one of the first conductive lines in the pair of first conductive lines and includes:
   a lower memory portion disposed to be in contact with the channel element,
   an upper memory portion disposed on the one of the first conductive lines in the pair of first conductive lines and opposite to the lower memory portion,
   a first side memory portion disposed to be in contact with one of the second conductive lines in the pair of second conductive lines, and
   a second side memory portion disposed to be in contact with the other one of the second conductive lines in the pair of second conductive lines.

4. The semiconductor device according to claim 1, wherein the second memory element surrounds the other one of the first conductive lines in the pair of first conductive lines and includes:
   an upper memory portion disposed to be in contact with the channel element,
   a lower memory portion disposed on the other one of the first conductive lines in the pair of first conductive lines and opposite to the upper memory portion,
   a first side memory portion disposed to be in contact with one of the second conductive lines in the pair of second conductive lines, and
   a second side memory portion disposed to be in contact with the other one of the second conductive lines in the pair of second conductive lines.

5. The semiconductor device according to claim 1, wherein
   the channel element incudes an inner surface,
   the semiconductor device further comprises a dielectric layer disposed on the inner surface of the channel element to confine the air gap.

6. The semiconductor device according to claim 1, wherein each of the first conductive lines in the pair of first conductive lines serves as a word line.

7. The semiconductor device according to claim 1, wherein one of the second conductive lines in the pair of second conductive lines serves as a source line and the other one of the second conductive lines in the pair of second conductive lines serves as a bit line.

8. A semiconductor device comprising:
   a substrate; and
   a memory structure disposed over the substrate and including:
      a first channel element and a second channel element,
      an air gap located in at least one of the first channel element and the second channel element,
      a first conductive line disposed between the first channel element and the second channel element, and
      a memory element disposed to separate the first conductive line from the first channel element and the second channel element.

9. The semiconductor device according to claim 8, wherein the memory structure further includes a pair of second conductive lines disposed transversely relative to the first conductive line and at two opposite sides of the memory element such that each of the second conductive lines in the pair of second conductive lines is in contact with the first channel element, the second channel element, and the memory element.

10. The semiconductor device according to claim 9, wherein the first channel element includes:
    a lower channel portion disposed to be in contact with the memory element,
    an upper channel portion spaced apart from the lower chancel portion by the air gap,
    a first side channel portion disposed to be in contact with one of the second conductive lines in the pair of second conductive lines, and
    a second side channel portion disposed to be in contact with the other one of the second conductive lines in the pair of second conductive lines.

11. The semiconductor device according to claim 9, wherein the second channel element includes:
    an upper channel portion disposed to be in contact with the memory element,
    a lower channel portion spaced apart from the upper channel portion by the air gap, a first side channel region disposed to be in contact with one of the second conductive lines in the pair of second conductive lines, and a second side channel portion disposed to be in contact with the other one of the second conductive lines in the pair of second conductive lines.

12. The semiconductor device according to claim 9, wherein the memory element surrounds the first conductive line and includes:

an upper memory portion disposed to be in contact with the first channel element, a lower memory portion disposed to be in contact with the second channel element, a first side memory portion disposed to be in contact with one of the second conductive lines in the pair of second conductive lines, and a second side memory portion disposed to be in contact with the other one of the second conductive lines in the pair of second conductive lines.

13. The semiconductor device according to claim 8, wherein the first conductive line serves as a word line.

14. The semiconductor device according to claim 9, wherein one of the second conductive lines in the pair of second conductive lines serves as a source line and the other one of the second conductive lines in the pair of second conductive lines serves as a bit line.

15. The semiconductor device according to claim 8, wherein each of the first channel element and the second channel element includes an inner surface, and the semiconductor device further comprises a dielectric layer disposed on the inner surface of the at least one of the first channel element and the second channel element to confine the air gap.

16. A semiconductor device comprising:

a substrate; and a memory structure disposed over the substrate in a first direction normal to the substrate, and including:

first conductive lines elongated in a second direction transverse to the first direction, and disposed in an array arrangement which includes a plurality of columns spaced apart from each other in a third direction transverse to the first direction and the second direction, the first conductive lines in each of the plurality of columns being spaced apart from each other in the first direction;

second conductive lines elongated in the first direction, and disposed in an array arrangement which includes a plurality of columns spaced apart from each other in the third direction, the second conductive lines in each of the plurality of columns being spaced apart from each other in the second direction;

memory elements elongated in the second direction, and disposed in an array arrangement which includes a plurality of columns spaced apart from each other in the third direction, the memory elements in each of the plurality of columns being spaced part from each other in the first direction;

channel elements disposed in a three-dimensional array arrangement which includes a plurality of two-dimensional arrays spaced apart from each other in the third direction, each of the plurality of two-dimensional arrays including a plurality of columns spaced apart from each other in the first direction, the channel elements in each of the plurality of columns of each of the plurality of two-dimensional arrays being spaced apart from each other in the second direction; and a first air gap located in at least one of the channel elements.

17. The semiconductor device according to claim 16, further comprising:

a dielectric material disposed among the memory elements and among the second conductive lines; and a second air gap located in the dielectric material disposed between two adjacent ones of the memory elements.

18. The semiconductor device according to claim 17, further comprising a third air gap located in the dielectric material disposed between two adjacent ones of the second conductive lines.

19. The semiconductor device according to claim 16, wherein the at least one of the channel elements includes an inner surface and the first air gap is defined by the inner surface.

20. The semiconductor device according to claim 16, wherein the at least one of the channel elements incudes an inner surface, and the semiconductor device further comprises a dielectric layer disposed on the inner surface to confine the first air gap.

* * * * *